(12) United States Patent
Kong et al.

(10) Patent No.: US 11,733,748 B2
(45) Date of Patent: *Aug. 22, 2023

(54) DISPLAY DEVICE

(71) Applicant: Samsung Display Co., LTD., Yongin-si (KR)

(72) Inventors: Jihye Kong, Seongnam-si (KR); Jeong-Soo Lee, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/897,669

(22) Filed: Aug. 29, 2022

(65) Prior Publication Data

US 2022/0413569 A1 Dec. 29, 2022

Related U.S. Application Data

(63) Continuation of application No. 17/206,385, filed on Mar. 19, 2021, now Pat. No. 11,481,008.

(30) Foreign Application Priority Data

Apr. 10, 2020 (KR) ........................ 10-2020-0044292

(51) Int. Cl.
*G06F 1/18* (2006.01)
*G09G 3/3275* (2016.01)

(52) U.S. Cl.
CPC ........... *G06F 1/189* (2013.01); *G09G 3/3275* (2013.01); *G09G 2300/0426* (2013.01)

(58) Field of Classification Search
CPC ................. G06F 1/189; G09G 3/3275; G09G 2300/0426

See application file for complete search history.

(56) References Cited

U.S. PATENT DOCUMENTS

| 8,797,491 | B2 | 8/2014 | Kim et al. | |
|---|---|---|---|---|
| 10,050,064 | B2* | 8/2018 | Koide | H10K 59/131 |
| 10,411,083 | B2 | 9/2019 | Song et al. | |
| 10,691,241 | B2* | 6/2020 | Kim | G09G 3/3655 |
| 2005/0286004 | A1* | 12/2005 | Lee | G02F 1/1345 |
| | | | | 349/139 |
| 2009/0167654 | A1* | 7/2009 | Kim | G02F 1/1345 |
| | | | | 345/87 |

(Continued)

FOREIGN PATENT DOCUMENTS

| JP | 6560887 | 8/2019 |
|---|---|---|
| KR | 101627245 | 6/2016 |

(Continued)

*Primary Examiner* — Ibrahim A Khan
(74) *Attorney, Agent, or Firm* — Cantor Colburn LLP

(57) ABSTRACT

A display device includes a plurality of pixels and an upper signal line providing a data signal to the pixels. The upper signal line includes a first upper signal line including a first metal material, a second upper signal line including a second metal material which is different from the first metal material, and a third upper signal line including the first metal material. The first, second and third upper signal lines are arranged in order and respectively electrically connected to a plurality of connection lines including the second metal material. The connection lines are connected to a plurality of lower signal lines.

19 Claims, 14 Drawing Sheets

(56) References Cited

U.S. PATENT DOCUMENTS

| | | | |
|---|---|---|---|
| 2012/0147311 A1* | 6/2012 | Chen | G02F 1/136259 |
| | | | 349/139 |
| 2014/0134809 A1* | 5/2014 | Bai | H01L 29/66765 |
| | | | 438/158 |
| 2016/0054832 A1* | 2/2016 | Kim | G06F 3/0445 |
| | | | 345/174 |
| 2016/0202814 A1* | 7/2016 | Lee | G06F 3/0443 |
| | | | 345/173 |
| 2017/0148374 A1* | 5/2017 | Lee | G09G 5/14 |
| 2017/0249911 A1* | 8/2017 | Ito | G09G 3/2003 |
| 2017/0287937 A1* | 10/2017 | Ka | H01L 27/1244 |
| 2017/0308196 A1* | 10/2017 | Jeong | H10K 50/844 |
| 2017/0365217 A1* | 12/2017 | An | G09G 3/3258 |
| 2017/0373270 A1* | 12/2017 | Kim | H10K 77/111 |
| 2018/0033832 A1* | 2/2018 | Park | G06F 3/04164 |
| 2018/0040672 A1* | 2/2018 | Park | H10K 59/88 |
| 2018/0069053 A1* | 3/2018 | Bok | G06F 3/0412 |
| 2018/0122863 A1* | 5/2018 | Bok | G06F 3/0446 |
| 2018/0122889 A1* | 5/2018 | Kim | G06F 3/0416 |
| 2018/0130856 A1* | 5/2018 | Kim | H10K 59/131 |
| 2018/0197484 A1* | 7/2018 | Moon | H01L 27/12 |
| 2018/0277569 A1 | 9/2018 | Hanari | |
| 2018/0350701 A1* | 12/2018 | Kim | G02F 1/1345 |
| 2019/0019441 A1* | 1/2019 | Shin | H10K 77/111 |
| 2019/0035869 A1* | 1/2019 | Kim | H10K 50/844 |
| 2019/0067410 A1* | 2/2019 | Kwon | H10K 77/111 |
| 2019/0096979 A1* | 3/2019 | Jo | H05K 1/189 |
| 2019/0103455 A1* | 4/2019 | Song | H10K 59/131 |
| 2019/0280013 A1* | 9/2019 | Fujikawa | H01L 27/0248 |
| 2020/0133085 A1* | 4/2020 | Shirai | G02F 1/136286 |
| 2020/0333909 A1* | 10/2020 | Chen | G06F 3/0412 |
| 2020/0388636 A1* | 12/2020 | Yueh | H01L 27/124 |
| 2021/0066441 A1 | 3/2021 | Jung et al. | |
| 2021/0296403 A1* | 9/2021 | Jin | G06F 3/0446 |

FOREIGN PATENT DOCUMENTS

| | | |
|---|---|---|
| KR | 1020190038718 | 4/2019 |
| KR | 1020210027641 | 3/2021 |

* cited by examiner

DISPLAY DEVICE

This application is a continuation application of U.S. patent application Ser. No. 17/206,385 filed on Mar. 19, 2021, which claims priority to Korean Patent Application No. 10-2020-0044292, filed on Apr. 10, 2020, and all the benefits accruing therefrom under 35 U.S.C. § 119, the contents of which are hereby incorporated by reference in its entirety.

BACKGROUND

1. Field

One or more embodiment relates to a display device. More particularly, one or more embodiment relates to a display device having improved display quality.

2. Description of the Related Art

A display device displays various images through a display screen to provide information to outside the display device. In general, the display device displays the image within a planar area of the display screen allocated thereto.

The display device includes a display area displaying information and a non-display area which surrounds the display area.

As a size of the display device increases, the number of signal lines arranged in the non-display area increases in order to increase a size of a display panel which is connected to the signal lines and to realize a high resolution. As a result, an electrical resistance of the signal lines increases, and display characteristics of the display device are deteriorated.

SUMMARY

One or more embodiment provides a display device having a narrow bezel and improved display quality.

One or more embodiment relates to a display device in which electrical resistance of conductive signal lines is reduced, to secure a scan time of each of the conductive signal lines, and to improve display quality of the display device.

Embodiments provide a display device including a base layer, including: a first portion; a second portion extending from the first portion; and a third portion extending from the second portion, in a direction away from the first portion; a first light emitting element, a second light emitting element and a third light emitting element on the first portion in order along the base layer; a first upper signal line, a second upper signal line and a third upper signal line on the first portion in order along the base layer and electrically connected to the first light emitting element, the second light emitting element and the third light emitting element, respectively; a first lower signal line, a second lower signal line and a third lower signal line on the third portion, in order along the base layer; and a first connection line, a second connection line and a third connection line on the second portion, electrically connecting the first upper signal line, the second upper signal line and the third upper signal line to the first lower signal line, the second lower signal line and the third lower signal line, respectively. The first upper signal line and the third upper signal line on the first portion of the base layer each includes a first metal material, and the second upper signal line on the first portion of the base layer and the first connection line, the second connection line and the third connection line on the second portion of the base layer each includes a second metal material which is different from the first metal material.

The first upper signal line may be spaced apart from the third upper signal line by a distance equal to or greater than about 0.25 micrometers.

One among the first lower signal line and the second lower signal line may include the first metal material, and the other among the first lower signal line and the second lower signal line may include the second metal material.

The base layer which is bent at the second portion may dispose the third portion facing the first portion.

The display device further may include a first insulating layer, a second insulating layer, a third insulating layer and a fourth insulating layer in order from the base layer; and over the second portion of the base layer, an opening which is defined through each of the first insulating layer, the second insulating layer and the third insulating layer and exposes the base layer to outside the first insulating layer, the second insulating layer and the third insulating layer. Along a thickness direction of the base layer: the fourth insulating layer may extend into the opening, the first upper signal line may be between the first insulating layer and the second insulating layer, the second upper signal line may be between the third insulating layer and the fourth insulating layer, and the third upper signal line may be between the second insulating layer and the third insulating layer.

The opening is provided in plural including a first opening, a second opening and a third opening. The first, second and third connection lines may be between the third and fourth insulating layers and may respectively extend into first, second and third openings.

The first, second and third insulating layers may include an inorganic material, and the fourth insulating layer may include an organic material.

The display device may further include a transistor on the first portion of the base layer and electrically connected to the first light emitting element, and a connection electrode which is electrically connected to the transistor. The transistor may include a source, a drain and an active area which each face the base layer with the first insulating layer thereabove, and a gate between the first and second insulating layers. The connection electrode may be between two insulating layers adjacent to each other among the first, second, third and fourth insulating layers.

The first lower signal line may be between the first insulating layer and the second insulating layer, the second lower signal line may be between the third insulating layer and the fourth insulating layer and the third lower signal line may be between the second insulating layer and the third insulating layer.

The display device may further include a data driving circuit on the third portion electrically connected to the first, second and third lower signal lines.

The second upper signal line may be integral with the second connection line.

The display device may further include: a fourth light emitting element on the first portion, the first light emitting element, the second light emitting element, the third light emitting element and the fourth light emitting element in order along the base layer; a fourth upper signal line on the first portion which is electrically connected to the fourth light emitting element and includes the second metal material, and the first upper signal line, the second upper signal line, the third upper signal line and the fourth upper signal line in order along the base layer, a fourth lower signal line on the third portion of base layer, the first lower signal line, the second lower signal line, the third lower signal line and the fourth lower signal line in order along the base layer; and a fourth connection line on the second portion of the base layer, the first connection line, the second connection line, the third connection line and the fourth connection line in order along the base layer, the fourth connection line electrically connecting the fourth upper signal line to the fourth lower signal line and including the second metal material.

The first and third lower signal lines may include the second metal material, and the second and fourth lower signal lines may include the first metal material.

The first and third lower signal lines may include the first metal material, and the second and fourth lower signal lines may include the second metal material.

Embodiments provide a display device including a base layer including a first portion; a second portion extending from the first portion, and a third portion extending from the second portion, in a direction away from the first portion; a first light emitting element, a second light emitting element and a third light emitting element on the first portion in order along the base layer; a first upper signal line, a second upper signal line and a third upper signal line on the first portion in order along the base layer and electrically connected to the first light emitting element, the second light emitting element and the third light emitting element, respectively; a first lower signal line, a second lower signal line and a third lower signal line on the third portion, in order along the base layer, and a first connection line, a second connection line and a third connection line on the second portion, in order along the base layer and electrically connecting the first upper signal line, the second upper signal line and the third upper signal line to the first lower signal line, the second lower signal line and the third lower signal line, respectively. The first upper signal line has a first width along the base layer and the second upper signal line has a second width along the base layer which is smaller than the first width of the first upper signal line, and the third upper signal line has a third width along the base layer which is equal to the first width.

The base layer which is bent at the second portion of the base layer may dispose the third portion facing the first portion.

Each of the first and third upper signal lines on the first portion of the base layer may include a first metal material, and the second upper signal line on the second portion of the base layer and each of the first, second, and third connection lines on the second portion of the base layer may include a second metal material which is different from the first metal material.

One among the first lower signal line and the third lower signal lines may include a first metal material, and the other among the first lower signal line and the third lower signal line may include a second metal material which is different from the first metal material.

The display device may further include a first insulating layer, a second insulating layer, a third insulating layer and a fourth insulating layer in order from the base layer; over the second portion of the base layer, an opening which is defined through each of the first insulating layer, the second insulating layer and the third insulating layer and exposes the base layer to outside the first insulating layer, the second insulating layer and the third insulating layer. Along a thickness direction of the bae layer: the fourth insulating layer may extend into the opening, the first upper signal line may be between the first insulating layer and the second insulating layer, the second upper signal line may be between the third insulating layer and the fourth insulating layer, and the third upper signal line may be between the second insulating layer and the third insulating layer.

The opening is provided in plural including a first opening, a second opening and a third opening. The first, second, and third connection lines may be between the third and fourth insulating layers and respectively extend into first, second and third openings.

According to one or more embodiment, as the signal lines transmitting a data signal are stacked in multiple layers along a thickness direction of the display device, the display device may have a narrow bezel, and thus, aesthetics of the display device may be improved. In addition, a difference in color between the pixels may be reduced, and thus, the display quality of the display device may be improved.

BRIEF DESCRIPTION OF THE DRAWINGS

The above and other advantages will become readily apparent by reference to the following detailed description when considered in conjunction with the accompanying drawings where.

DETAILED DESCRIPTION

Figure 1A:
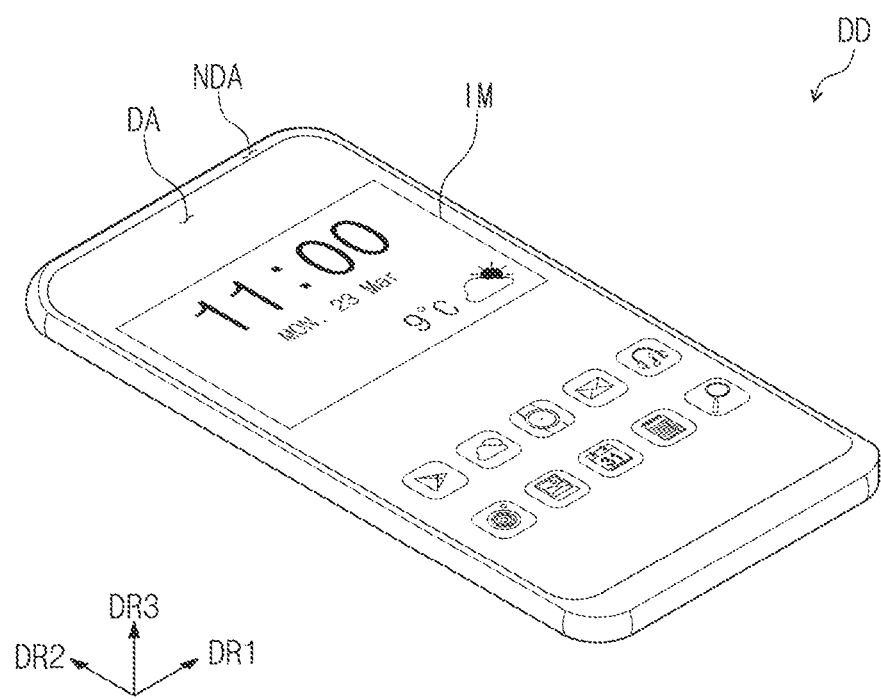
FIG. 1A is a perspective view showing an embodiment of a display device.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like numerals refer to like elements throughout. In the drawings, the thickness, ratio, and dimension of components are exaggerated for effective description of the technical content.

It will be understood that when an element or layer is referred to as being related to another element such as being "on," "connected to" or "coupled to" another element or layer, it can be directly on, connected or coupled to the other element or layer or intervening elements or layers may be present. In contrast, when an element or layer is referred to as being related to another element such as being "on," "connected to" or "coupled to" another element or layer, no other element or layer or intervening elements or layers are present therebetween.

The terminology used herein is for the purpose of describing particular embodiments only and is not intended to be limiting. As used herein, the singular forms, "a," "an" and "the" are intended to include the plural forms as well, unless the context clearly indicates otherwise. "At least one" is not to be construed as limiting "a" or "an." "Or" means "and/or." As used herein, the term "and/or" may include any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the embodiments. Spatially relative terms, such as "beneath," "below," "lower," "above," "upper" and the like, may be used herein for ease of description to describe one element or feature's relationship to another element(s) or feature(s) as illustrated in the figures.

It will be further understood that the terms "may include" and/or "including", when used in this specification, specify the presence of stated features, integers, steps, operations, elements, and/or components, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within +30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments will be described with reference to accompanying drawings.

Figure 1B:
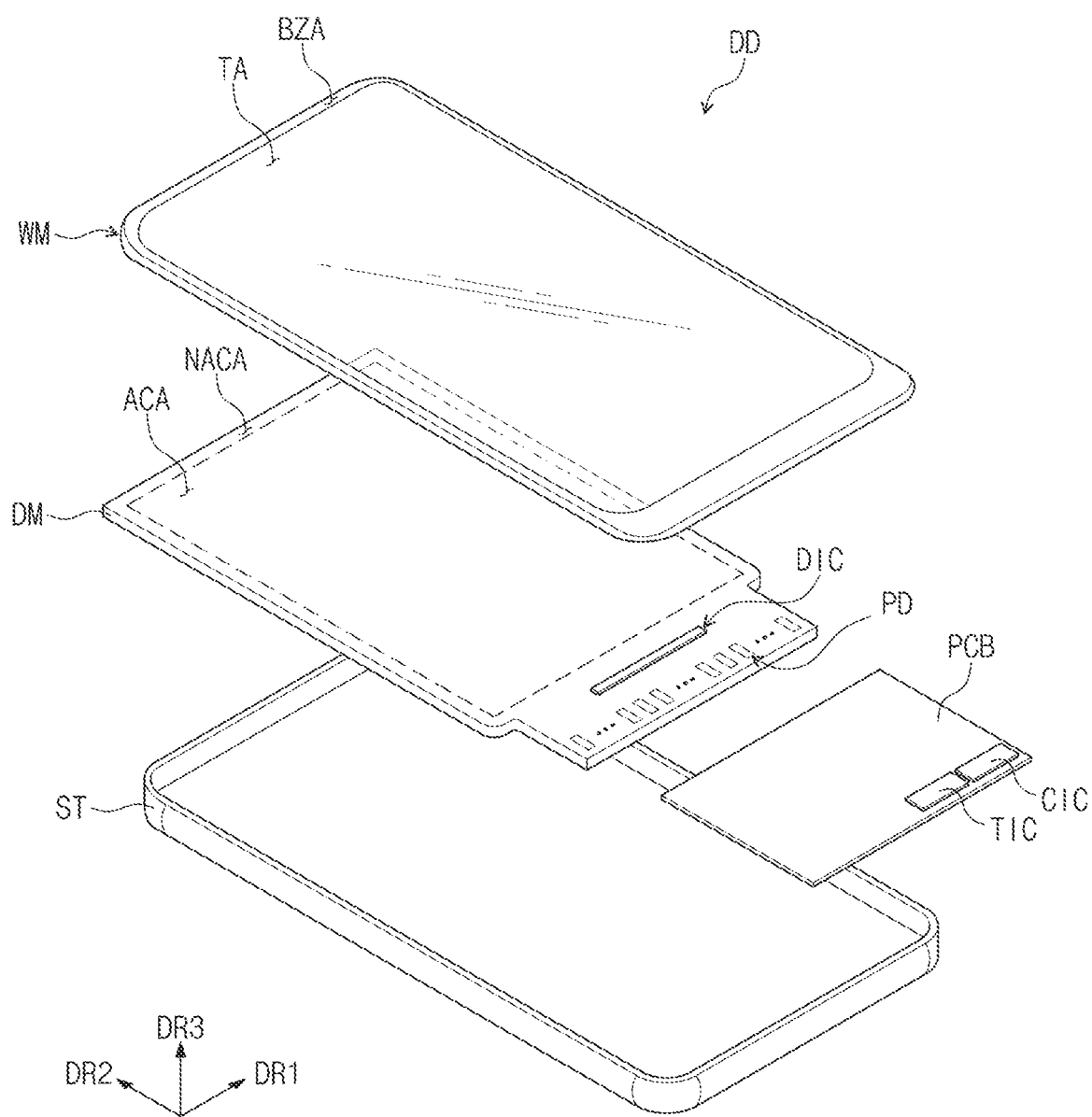
FIG. 1B is an exploded perspective view showing an embodiment of a display device.

FIG. 1A is a perspective view showing an embodiment of a display device DD. FIG. 1B is an exploded perspective view showing the display device DD of FIG. 1A.

FIG. 1A shows the display device DD that is applied to a smartphone as a representative example. However, the display device DD may be applied to a large-sized electronic item, such as a television set or a monitor, and/or a small and medium-sized electronic item, such as a mobile phone, a tablet computer, a car navigation unit, a game unit and a smart watch.

The display device DD may include a display area DA and a non-display area NDA, which are defined therein. The display area DA may display an image IM and/or may sense an input from outside the display device DD (e.g., an external input), for instance, a touch event.

The display area DA is a planar area which is substantially parallel to a plane defined by a first direction DR1 and a second direction DR2 which cross each other. A third direction DR3 indicates a normal line direction of the display area DA, e.g., a thickness direction of the display device DD. Front (or upper) and rear (or lower) surfaces of a member or layer are distinguished from each other along the third direction DR3. However, directions indicated by the first, second and third directions DR1, DR2 and DR3 are relative to each other and may be changed to other directions.

The planar shape of the display area DA which is shown in FIG. 1A is exemplary, and the planar shape of the display area DA may be changed without being limited thereto. The non-display area NDA may be defined adjacent to the display area DA, and the image IM may not be displayed in the non-display area NDA. The non-display area NDA may define a bezel area BZA of the display device DD. The non-display area NDA may surround the display area DA in a plan view (e.g., along the third direction DR3), however, should not be limited thereto or thereby. The planar shape of the display area DA and the planar shape of the non-display area NDA may be varied. Various elements or layers of the display device DD may include a display area DA, a non-display area NDA and a bezel area BZA described above for the display device DD.

Referring to FIG. 1B, the display device DD may include a window WM, a display module DM and a housing ST. The window WM may include a transmission area TA and a bezel area BZA, which are defined therein, however, should not be limited thereto or thereby. That is, the window WM may further include another planar area defined therein.

The transmission area TA may transmit a light incident thereto. In detail, the image IM generated by the display module DM may be viewed from outside the display device DD after passing through the transmission area TA. The transmission area TA may overlap the display area DA (refer to FIG. 1A) and be a planar area through which light and/or an image IM is transmitted to outside the display device DD.

The bezel area BZA may be defined adjacent to the transmission area TA. In detail, the bezel area BZA may surround the transmission area TA in the plan view. In an embodiment, the bezel area BZA may have a predetermined color. The bezel area BZA may overlap or correspond to the non-display area NDA (refer to FIG. 1A).

The display module DM may be disposed under the window WM. The display module DM may be protected from external impacts by the window WM.

The display module DM may include an active area ACA and a non-active area NACA, which are defined therein. The active area ACA may correspond to the display area DA of FIG. 1A, may display the image IM, and may sense the external input.

The non-active area NACA may correspond to the non-display area NDA, and conductive lines that provide and receive electrical signals to and from the active area ACA may be disposed in the non-active area NACA. The conductive lines may represent signal lines which connect elements or layers within the active area ACA to elements or layers within the non-active area NACA. In an embodiment, the signal lines provide a signal transmittance between a plurality of pixels PX and a plurality of pads PD.

A portion of the housing ST may be disposed under the display module DM. That is, the portion of the housing ST which is under the display module DM may face the window WM with the display module DM therebetween. The housing ST may accommodate therein the window WM and the display module DM.

Figure 2:
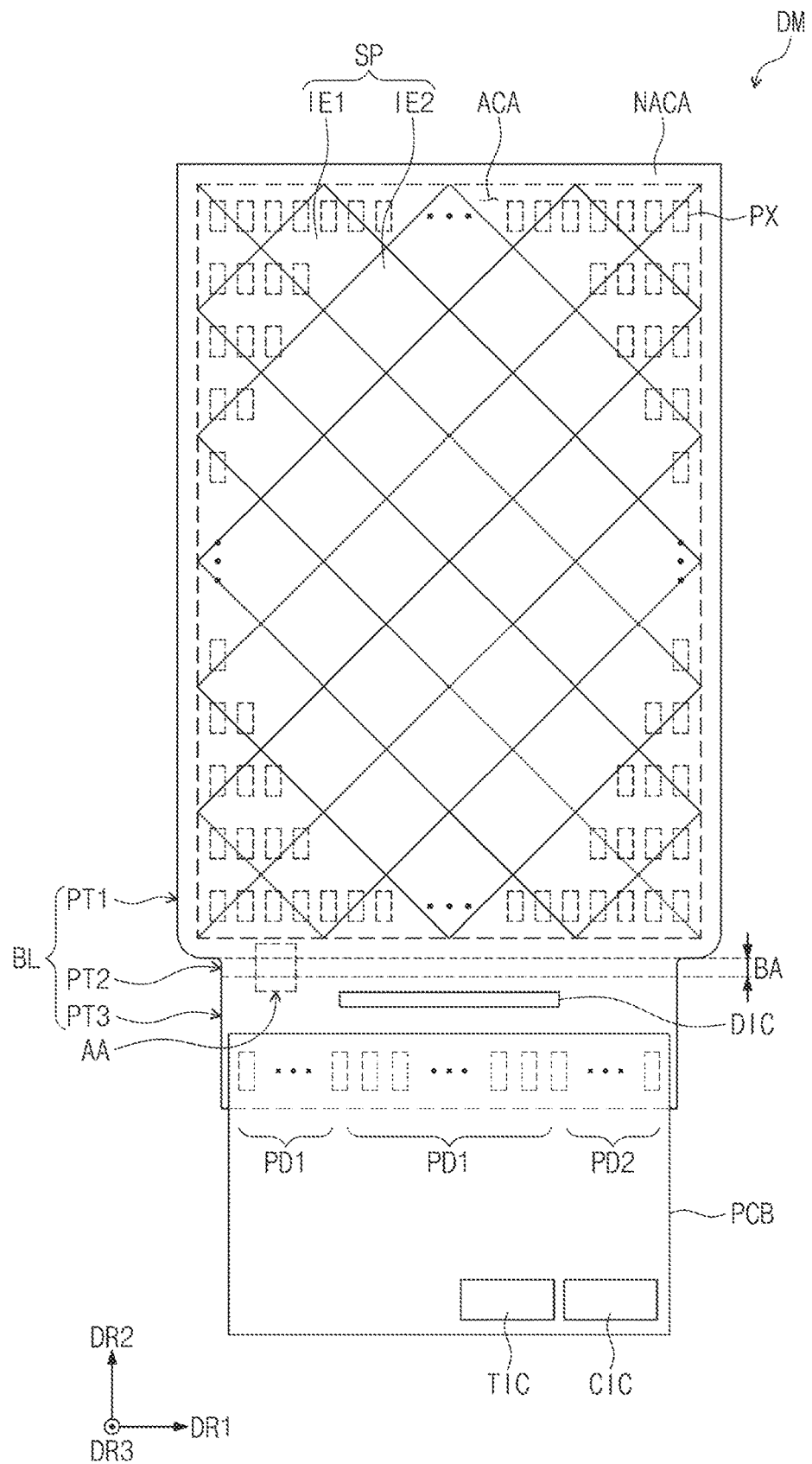
FIG. 2 is a top plan view showing an embodiment of a display module.
Figure 3:
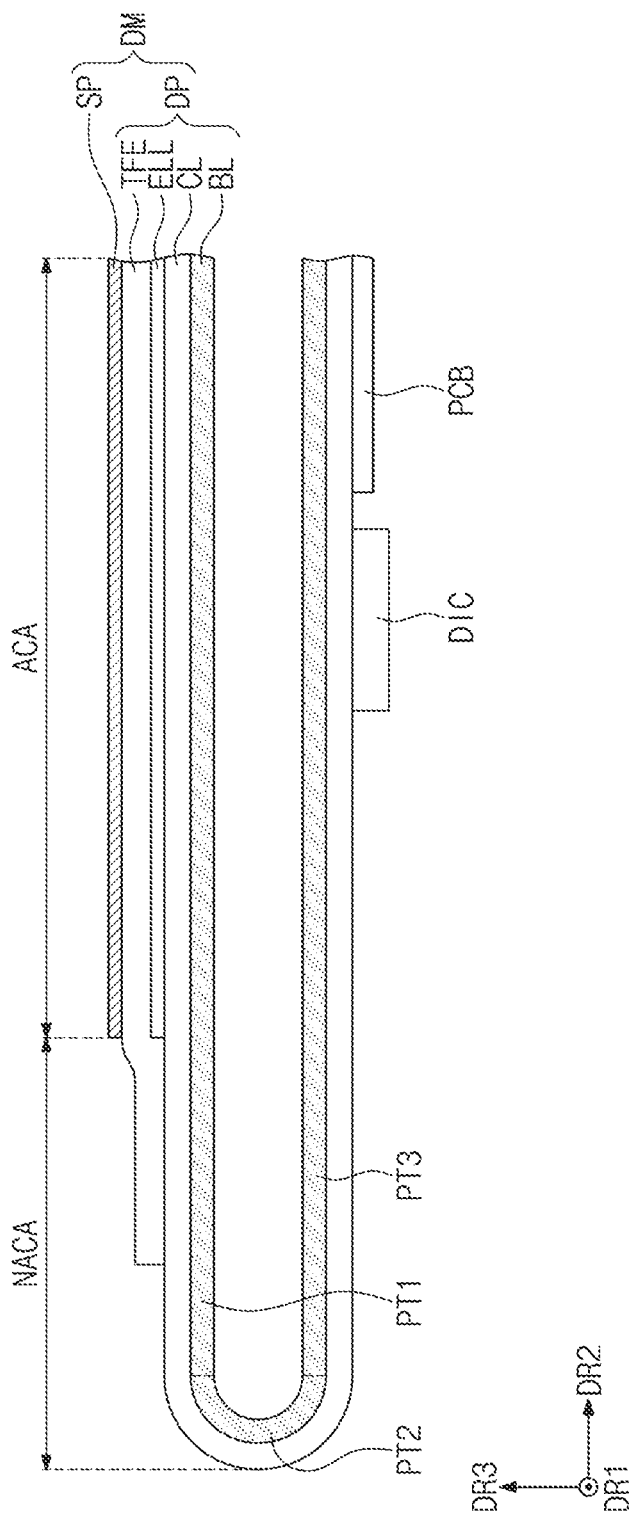
FIG. 3 is a cross-sectional view showing the display module shown in FIG. 2, which is bent.

FIG. 2 is a plan view showing an embodiment of the display module DM. Additionally, a data driving circuit DIC and a pad PD which is provided in plural including a plurality of pads PD are shown in FIG. 2. FIG. 3 is an enlarged cross-sectional view showing an embodiment of the display module DM which is shown in FIG. 2, which is bent at a bending area BA thereof. That is, the display module DM and/or the display panel DP is bendable, and the bending area BA is a planar area at which the display module DM and/or the display panel DP is bendable. Various elements or layers of the display device DD and/or the display module DM may include a bending area BA corresponding to that described above.

The display module DM may include a display panel DP, an input sensor SP (e.g., input sensing layer), the data driving circuit DIC (e.g., first driving circuit), the pad PD which is provided in plural, a printed circuit board PCB, an input sensing driving circuit TIC (e.g., second driving circuit) and a control driving circuit CIC (e.g., third driving circuit).

The display panel DP may include a base layer BL, a circuit layer CL, a light emitting element layer ELL and a thin film encapsulation layer TFE (e.g., encapsulation layer). The circuit layer CL, the light emitting element layer ELL and the thin film encapsulation layer TFE may be in order from the base layer BL. The base layer BL may include polyimide ("PI"), however, should not be limited to polyimide. The base layer BL may include or define a first portion PT1, a second portion PT2 extending from the first portion PT1, and a third portion PT3 extending from the second portion PT2 in a direction away from the first portion PT1. In an embodiment, the first portion PT1, the second portion PT2 and the third portion PT3 may be provided integrally with each other to form the base layer BL. The first portion PT1, the second portion PT2 and the third portion PT3 are disposed in order. The third portion PT3 defines an end surface or edge of the base layer BL which is furthest from the active area ACA along the second direction DR2. The end surface or edge of the base layer BL extends along the first direction DR1. The end surface or edge of the base layer BL may define an end surface or edge of the display panel DP which is furthest from the active area ACA along the second direction DR2.

The second portion PT2 may be a planar area at which the base layer BL is bendable to form a curvature. The display panel DP which is bent may dispose the third portion PT3 spaced apart from the first portion PT1 along the third direction DR3. The second portion PT2 of the base layer BL may be defined as the bending area BA. The display module DM which is unbent defines a length of the second portion PT2 of the base layer BL along the second direction DR2. The length is variable according to a design of the display device DD.

The first portion PT1 may be a portion of the base layer BL which is unbendable or remains flat (e.g., unbent) when the display module DM and/or the display panel DP is bent, without being limited thereto or thereby. Similarly, the third portion PT3 may be a portion of the base layer BL which is unbendable or remains flat (e.g., unbent) when the display module DM and/or the display panel DP is bent, without being limited thereto or thereby.

The display panel DP which is bent disposes the second portion PT2 bent downward from the first portion PT1 and disposes the third portion PT3 overlapping the first portion PT1 along the third direction DR3 (e.g., in the plan view). That is, the display panel DP which is bent at the second portion PT2 of the base layer BL disposes the third portion PT3 facing the first portion PT1 along the third direction DR3.

The circuit layer CL may be disposed on the base layer BL and may include a pixel driving circuit (e.g., pixel circuit CC) and signal lines (e.g., conductive lines). In an embodiment, for instance, the circuit layer CL may include a plurality of transistors T1 to T7 (refer to FIG. 4), a capacitor CP (refer to FIG. 4), and a plurality of signal lines (refer to FIG. 4) electrically connected to the transistors T1 to T7 (refer to FIG. 4).

Referring to FIG. 3, the circuit layer CL may overlap each of the first portion PT1, the second portion PT2 and the third portion PT3 of the base layer BL. However, configurations of the circuit layer CL corresponding to the first portion PT1, the second portion PT2 and the third portion PT3 may be different from each other. The circuit layer CL may include the pixel driving circuit disposed to correspond to the active area ACA of the first portion PT1 and the signal line disposed to correspond to the non-active area NACA of the first portion PT1. The circuit layer CL may include the signal lines disposed in different layers from each other to correspond to the second portion PT2 and the third portion PT3.

The light emitting element layer ELL may be disposed on the circuit layer CL and may overlap the first portion PT1 of the base layer BL. The light emitting element layer ELL may include a light emitting element LD (refer to FIG. 4) electrically connected to the transistors. A pixel PX which is provided in plural including pixels PX may be arranged in the light emitting element layer ELL, such as in a matrix form.

The thin film encapsulation layer TFE may be disposed on the light emitting element layer ELL and may encapsulate the light emitting element layer ELL. A portion of the thin film encapsulation layer TFE may overlap the non-active area NACA. Although not shown separately, an insulating layer may be further disposed between the light emitting element layer ELL and the thin film encapsulation layer TFE or between the thin film encapsulation layer TFE and the input sensor SP, to improve an optical property.

The input sensor SP may be disposed on the thin film encapsulation layer TFE and may overlap the first portion PT1 of the base layer BL. FIG. 3 shows the input sensor SP disposed directly on the thin film encapsulation layer TFE, however, is not limited thereto or thereby. In an embodiment, the input sensor SP may be coupled to the thin film encapsulation layer TFE by an adhesive layer.

The input sensor SP may include a first sensor IE1 and a second sensor IE2. Each of the first sensor IE1 and the second sensor IE2 may include an electrode of a metal material. Each of the first sensor IE1 and the second sensor IE2 may have a mesh shape.

The first sensor IE1 and the second sensor IE2 may be provided in plural including first sensors IE1 and second sensors IE2 respectively. The first sensors IE1 may form an electrical capacitance with the second sensors IE2. A touch applied to the active area ACA varies the electrical capacitance between the first sensor IE1 and the second sensor IE2. The input sensing driving circuit TIC may sense a variation in capacitance of the input sensor SP and may determine a location of the active area ACA at which the touch is applied.

The configuration of the input sensor SP should not be particularly limited. An input sensor SP of a mutual-capacitance driving scheme that includes two types of sensors may be applied to the display module DM, or an input sensor SP of a self-capacitance driving scheme that includes one type of sensor may be applied to the display module DM. As another way, an input sensor SP that is not a capacitive type sensor may be applied to the display module DM.

In the embodiment, the data driving circuit DIC may overlap the third portion PT3 of the base layer BL. That is, the data driving circuit DIC may be mounted or connected to the display panel DP at the third portion PT3 of the base layer BL.

The data driving circuit DIC may be electrically connected to the pixels PX of the active area ACA and may apply a data signal as an electrical signal, to the pixels PX.

The pads PD may include a plurality of first pads PD1 and a plurality of second pads PD2.

The first pads PD1 may transmit electrical signals to the pixels PX through the data driving circuit DIC. In the embodiment, the first pads PD1 may be electrically connected to at least one of the transistors T1 to T7 (refer to FIG. 4) of the pixels PX.

The second pads PD2 may be electrically connected to the input sensor SP. Each of the second pads PD2 may be electrically connected to one of the first sensors IE1 and the second sensors IE2.

The printed circuit board PCB may be electrically connected to the pads PD. That is, the printed circuit board PCB is connected to the display panel DP at the pads PD. The input sensing driving circuit TIC and the control driving circuit CIC may be mounted on the printed circuit board PCB. That is, the input sensing driving circuit TIC and the control driving circuit CIC of the printed circuit board PCB may be connected to the display panel DP, through the pads PD.

The input sensing driving circuit TIC may sense a variation in capacitance of the input sensor SP using the second pads PD2. Accordingly, the input sensing driving circuit TIC may sense the external touch applied to the active area ACA and a pressure applied to the active area ACA from outside the display device DD and/or the display module DM. The control driving circuit CIC may be used to control at least one of the data driving circuit DIC and the input sensing driving circuit TIC.

A portion of the display module DM, which corresponds to the second portion PT2 (or the bending area BA) of the base layer BL, may be bendable.

Although not shown separately, an anti-reflective member may be disposed between the display module DM and the window WM, along the third direction DR3. In the embodiment, the anti-reflective member may be a polarizing film or a polarizing plate.

Although not shown separately, the display module DM may further include a synthetic resin material layer or a synthetic resin material film disposed to correspond to the bending area BA. The synthetic resin material layer or the synthetic resin material film may reduce a stress of the signal lines disposed in the bending area BA.

Figure 4:
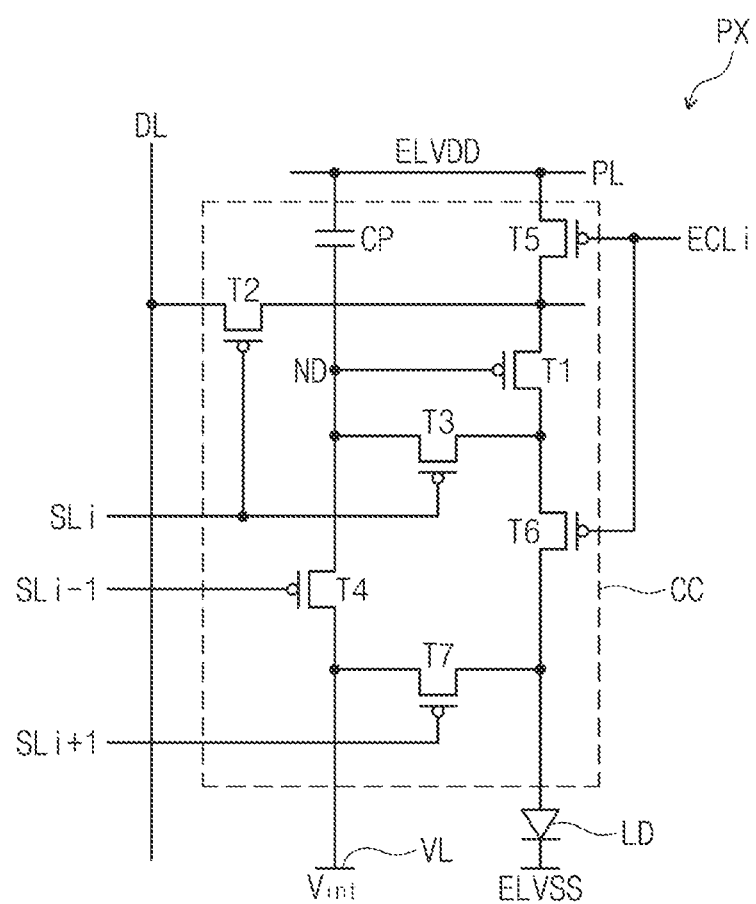
FIG. 4 is an equivalent circuit diagram showing an embodiment of a pixel.

FIG. 4 is an equivalent circuit diagram showing an embodiment of the pixel PX.

FIG. 4 shows the pixel PX connected to an i-th scan line SLi, an (i+1)th scan line SLi+1, and an i-th light emitting control line ECLi among the signal lines mentioned above.

The pixel PX may include the light emitting element LD and a pixel circuit CC. The pixel circuit CC may include the transistors T1 to T7 and the capacitor CP. The pixel circuit CC may control an amount of electrical current flowing through the light emitting element LD in response to the data signal.

The light emitting element LD may generate and/or emit light at a predetermined luminance in response to the amount of the electrical current provided from the pixel circuit CC. For this operation, an electric potential of a first power source voltage ELVDD may be set to be higher than an electric potential of a second power source voltage ELVSS. The first power source voltage ELVDD may be provided to a first power line PL among the signal lines mentioned above.

Each of the transistors T1 to T7 may include a source, a drain and a gate. The source, the drain and the gate may be implemented in the form of electrode or may be implemented as a portion of a semiconductor pattern ACP (referring to FIG. 5A). The source, the drain and the gate implemented in the form of electrode may include a metal material pattern. The source, the drain and the gate implemented as the portion of the semiconductor pattern ACP may include a semiconductor material area with a high doping concentration to have a conductivity. A semiconductor material area that is not doped or has a relatively low doping concentration may correspond to an active area of the transistors T1 to T7.

For the convenience of explanation, one of the source and the drain of the transistors T1 to T7 may be referred to as a "first electrode," and the other of the source and the drain of the transistors T1 to T7 may be referred to as a "second electrode." The gate of the transistors T1 to T7 may be referred to as a "control electrode."

A first electrode of a first transistor T1 may be connected to the first power line PL via a fifth transistor T5, and a second electrode of the first transistor T1 may be connected to an anode electrode AE of the light emitting element LD via a sixth transistor T6. The first transistor T1 may be referred to as a "driving transistor". The first transistor T1 may control the amount of the electrical current flowing through the light emitting element LD in response to a voltage applied to the control electrode thereof.

A second transistor T2 may be connected between a data line DL and the first electrode of the first transistor T1. A control electrode of the second transistor T2 may be connected to the i-th scan line SLi. The second transistor T2 may be turned on when an i-th scan signal (Si) is applied to the i-th scan line SLi and may electrically connect the data line DL and the first electrode of the first transistor T1 to each other.

A third transistor T3 may be connected between the second electrode and the control electrode of the first transistor T1. A control electrode of the third transistor T3 may be connected to the i-th scan line SLi. The third transistor T3 may be turned on when the i-th scan signal (Si) is applied to the i-th scan line SLi and may electrically connect the second electrode and the control electrode of the first transistor T1 to each other. Accordingly, when the third transistor T3 is turned on, the first transistor T1 may be connected in a diode configuration.

A fourth transistor T4 may be connected between a control node ND and a second power line VL among the signal lines mentioned above. A control electrode of the fourth transistor T4 may be connected to an (i−1)th scan line SLi−1. The fourth transistor T4 may be turned on when an (i−1)th scan signal (Si−1) is applied to the (i−1)th scan line SLi−1 and may apply an initialization voltage Vint as an electrical signal, to the control node ND.

The fifth transistor T5 may be connected between the first power line PL and the first electrode of the first transistor T1. A control electrode of the fifth transistor T5 may be connected to the i-th light emitting control line ECLi.

The sixth transistor T6 may be connected between the second electrode of the first transistor T1 and the anode electrode AE of the light emitting element LD. A control electrode of the sixth transistor T6 may be connected to the i-th light emitting control line ECLi.

A seventh transistor T7 may be connected between the second power line VL and the anode electrode AE of the light emitting element LD. A control electrode of the seventh transistor T7 may be connected to the (i+1)th scan line SLi+1. The seventh transistor T7 may be turned on when an (i+1)th scan signal (Si+1) is applied to the (i+1)th scan line SLi+1 and may apply the initialization voltage Vint to the anode electrode AE of the light emitting element LD.

The capacitor CP may be connected between the first power line PL and the control node ND. The capacitor CP may be charged with the voltage corresponding to the data signal. When the fifth transistor T5 and the sixth transistor T6 are turned on due to the voltage charged in the capacitor CP, the amount of the electrical current flowing through the first transistor T1 may be determined.

Each of the first to seventh transistors T1 to T7 shown in FIG. 4 may include an amorphous silicon semiconductor, a polysilicon semiconductor or an oxide semiconductor. In an embodiment, for example, all the first to seventh transistors T1 to T7 may include a low temperature polycrystalline silicon ("LTPS") semiconductor. As another way, some transistors of the first to seventh transistors T1 to T7 may include the LTPS semiconductor, and other transistors of the first to seventh transistor T1 to T7 may include the oxide semiconductor. In particular, the third transistor T3 and the fourth transistor T4 may include the oxide semiconductor, and the first, second, fifth, sixth and seventh transistors T1, T2, T5, T6 and T7 may include the LTPS semiconductor. However, embodiments should not be limited thereto or thereby.

Referring again to FIG. 4, the pixel PX is implemented by p-type metal oxide semiconductor ("PMOS") transistors, however, should not be limited thereto or thereby. In an embodiment, the pixel PX may be implemented by n-type metal oxide semiconductor ("NMOS") transistors. The pixel PX may be implemented by a combination of the NMOS transistors and the PMOS transistors. In an embodiment, for example, the third transistor T3 and the fourth transistor T4 may be implemented by the NMOS transistor, and the first, second, fifth, sixth and seventh transistors T1, T2, T5, T6 and T7 may be implemented by the PMOS transistor.

The configuration of the pixel PX should not be limited to that shown in FIG. 4. In an embodiment, the pixel PX may be implemented in various ways to allow the light emitting element LD to emit the light.

In an embodiment, the light emitting element LD may be a display element employing an organic light emitting element, a micro light emitting diode ("LED") or a quantum dot.

Figure 5A:
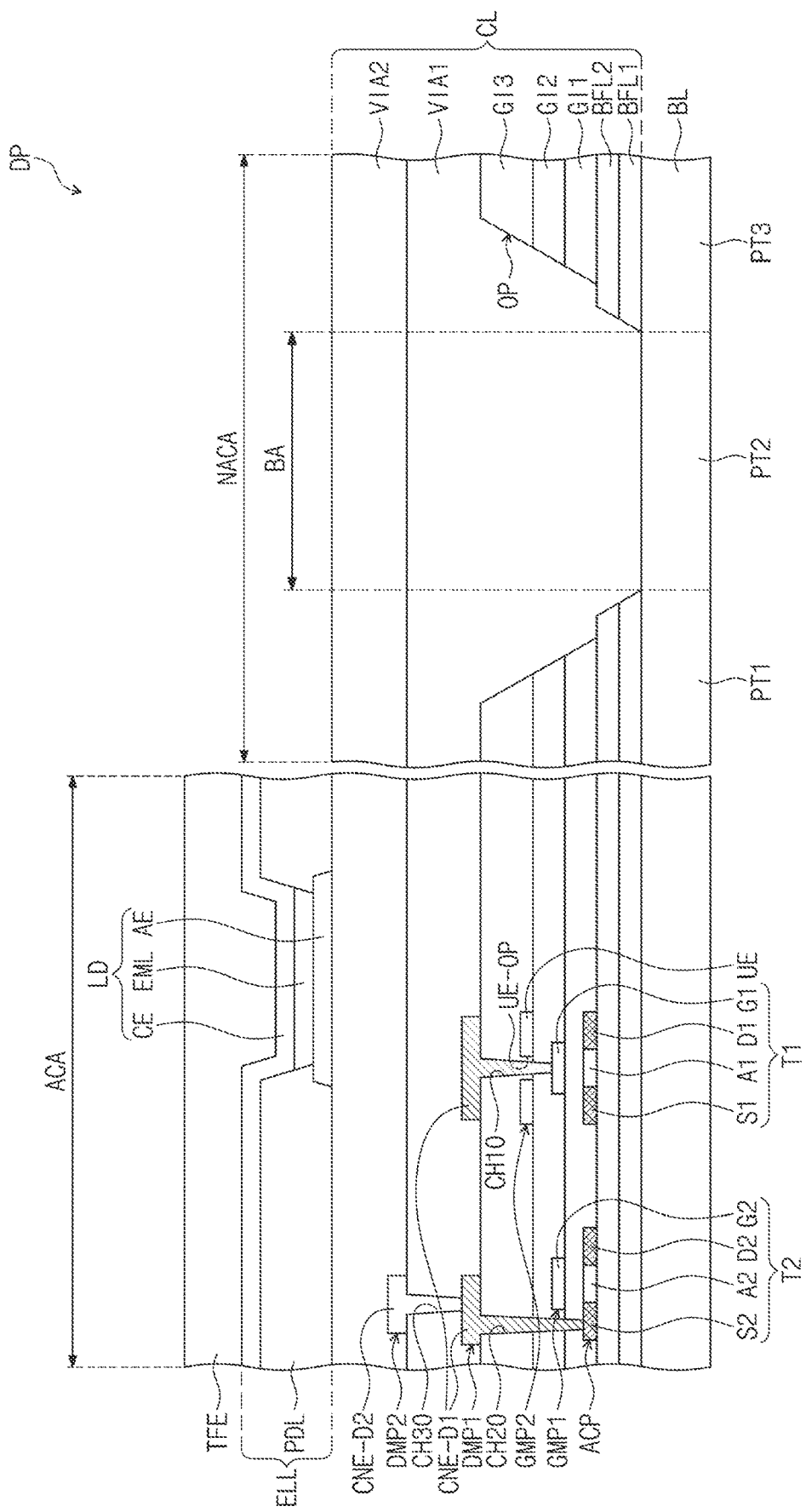
FIGS. 5A and 5B are enlarged cross-sectional views showing an embodiment of a display panel.
Figure 5B:
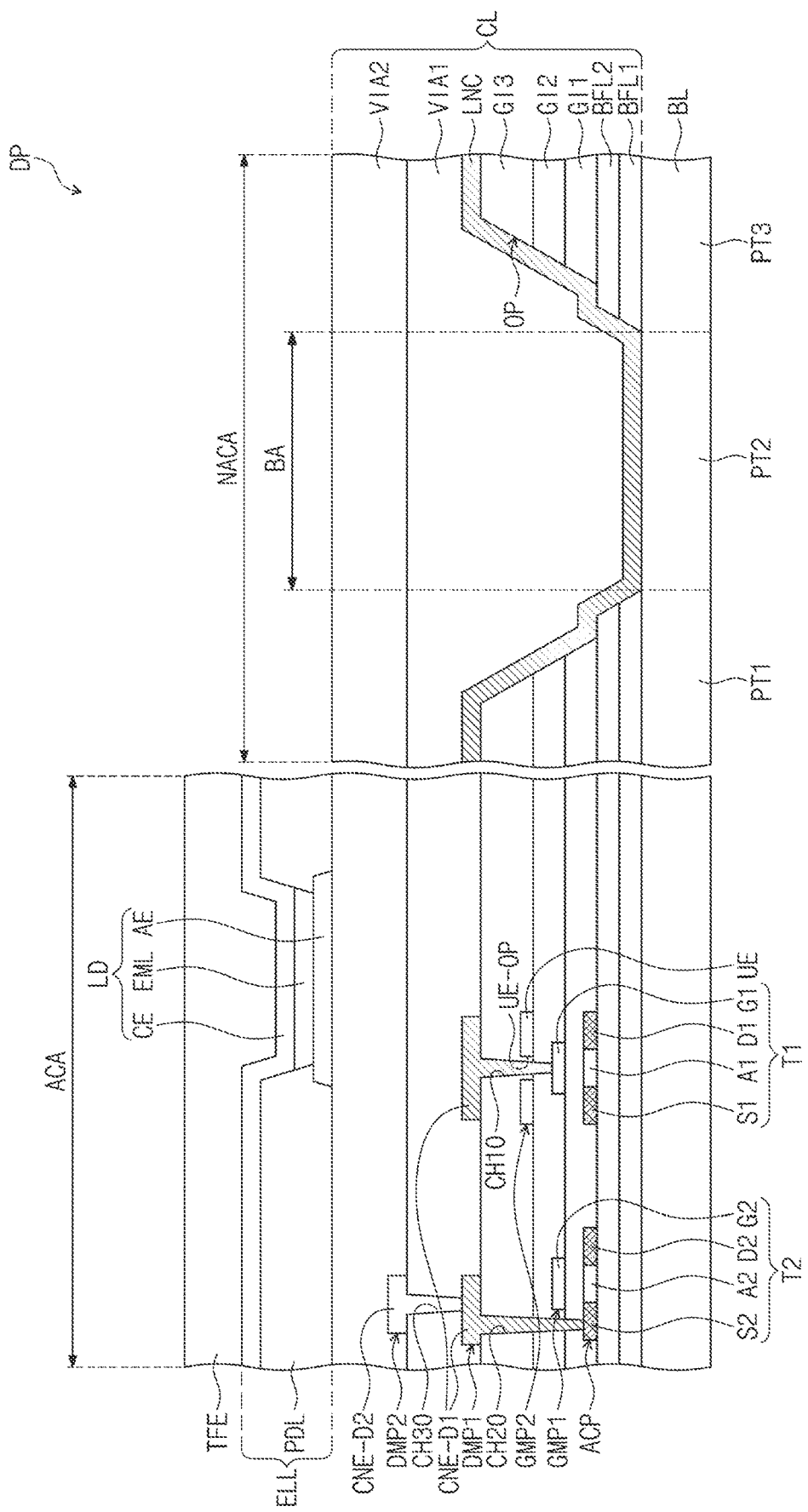

FIGS. 5A and 5B are enlarged cross-sectional views showing embodiments of the display panel DP. Each of FIGS. 5A and 5B includes a portion of the active area ACA and a portion of the non-active area NACA, FIG. 5A shows a cross-section that does not overlap the signal lines in the bending area BA, and FIG. 5B shows a cross-section that does overlap the signal lines in the bending area BA.

Referring to FIG. 5A, the circuit layer CL may include a first buffer layer BFL1, a second buffer layer BFL2, a first insulating layer GI1, a second insulating layer GI2, a third insulating layer GI3, a fourth insulating layer VIA1, a fifth insulating layer VIA2, a semiconductor layer including a semiconductor pattern ACP which is provided in plurality including a plurality of semiconductor patterns ACP, a first conductive layer GMP1 including a plurality of first conductive patterns, a second conductive layer GMP2 including a plurality of second conductive patterns, a third conductive layer DMP1 including a plurality of third conductive patterns, and a fourth conductive layer DMP2 including a plurality of fourth conductive patterns.

The first to seventh transistors T1 to T7 of the pixel PX, the scan lines SLi−1, SLi and SLi+1, the i-th light emitting control line ECLi, the first power line PL and the second power line VL which are shown in FIG. 4 may be provided or formed using the conductive patterns of the first, second, third and fourth conductive layers GMP1, GMP2, DMP1 and DMP2 and the semiconductor pattern ACP of the semiconductor layer.

Referring to FIG. 5A, the first conductive layer GMP1 may be a first gate metal pattern (e.g., first conductive pattern layer), the second conductive layer GMP2 may be a second gate metal pattern (e.g., second conductive pattern layer), the third conductive layer DMP1 may be a first data metal pattern (e.g., third conductive pattern layer), and the fourth conductive layer DMP2 may be a second data metal pattern (e.g., fourth conductive pattern layer), however, should not be limited thereto or thereby.

Each of the first insulating layer GI1, the second insulating layer GI2 and the third insulating layer GI3 may include an organic material layer and/or an inorganic material layer. In an embodiment, each of the first insulating layer GI1, the second insulating layer GI2 and the third insulating layer GI3 may include a plurality of inorganic material thin layers. The inorganic material thin layers may include a silicon nitride layer and a silicon oxide layer.

Each of the fourth insulating layer VIA1 and the fifth insulating layer VIA2 may include an organic material. Each of the first conductive layer GMP1 and the second conductive layer GMP2 may include patterns including a first metal material. Each of the metal patterns of the first conductive layer GMP1 and the second conductive layer GMP2 may have substantially the same electrical resistance. In an embodiment, for example, the first metal material may include molybdenum (Mo), however, should not be limited thereto or thereby.

In an embodiment, each of the third conductive layer DMP1 and the fourth conductive layer DMP2 may include patterns including a second metal material. The second metal material may be different from the first metal material.

In an embodiment, for example, the second metal material may include at least one of aluminum (Al) and titanium (Ti), however, should not be limited thereto or thereby. In an embodiment, each pattern of the third conductive layer DMP1 and the fourth conductive layer DMP2 may have a stacked structure in which titanium, aluminum and titanium are sequentially stacked along the third direction DR3.

The first buffer layer BFL1 may be disposed on the base layer BL. The second buffer layer BFL2 may be disposed on the first buffer layer BFL1. That is, the second buffer layer BFL2 may face the base layer BL with the first buffer layer BFL1 therebetween. Each of the first buffer layer BFL1 and the second buffer layer BFL2 may reduce or effectively prevent entry a foreign substance existing in the base layer BL to the pixel PX. In particular, each of the first buffer layer BFL1 and the second buffer layer BFL2 may reduce or effectively prevent diffusion of the foreign substance to the semiconductor pattern ACP of the transistors T1 to T7 (refer to FIG. 4) within the pixel PX.

The foreign substance may be introduced from outside the display panel DP or may be generated by a thermal decomposition of the base layer BL. The foreign substance may be gas or sodium discharged from the base layer BL. In addition, each of the first buffer layer BFL1 and the second buffer layer BFL2 may reduce or effectively prevent entry of moisture from outside the display panel DP to the pixel PX. In an embodiment, at least one of the first buffer layer BFL1 and the second buffer layer BFL2 may be omitted.

The semiconductor pattern ACP may be disposed on the second buffer layer BFL2. The semiconductor pattern ACP may form a portion of each of the transistors T1 to T7 (refer to FIG. 4). The semiconductor pattern ACP may include polysilicon, amorphous silicon or metal oxide semiconductor. FIG. 5A shows the semiconductor pattern ACP providing a first source S1, a first active area A1 and a first drain D1 of the first transistor T1 and the semiconductor pattern ACP forming a second source S2, a second active area A2 and a second drain D2 of the second transistor T2.

Referring again to FIG. 5A, the first insulating layer GI1 may be disposed on the second buffer layer BFL2 and may cover the semiconductor pattern ACP. The first source S1, the first active area A1 and the first drain D1 of the first transistor T1 and the second source S2, the second active area A2 and the second drain D2 of the second transistor T2 may be disposed under the first insulating layer GI1. The first conductive layer GMP1 may be disposed on the first insulating layer GI1. The first gate G1 of the first transistor T1 and the second gate G2 of the second transistor T2 are shown as respective patterns of the first conductive layer GMP1. Although not shown separately, a pattern of the first conductive layer GMP1 may provide one of two electrodes that form the capacitor CP of the pixel PX.

The second insulating layer GI2 may be disposed on the first insulating layer GI1 and may cover the first conductive layer GMP1. The second conductive layer GMP2 may be disposed on the second insulating layer GI2. A pattern of the second conductive layer GMP2 may provide the other electrode of the two electrodes that form the capacitor CP (refer to FIG. 4). An upper electrode UE is shown as a pattern of the second conductive layer GMP2. An electrode opening UE-OP may be defined through a thickness of the upper electrode UE.

The third insulating layer GI3 may be disposed on the second insulating layer GI2 and may cover the patterns of the second conductive layer GMP2. The third conductive layer DMP1 may be disposed on the third insulating layer GI3. A lower connection electrode CNE-D1 which is provided in plural is shown as a pattern of the third conductive layer DMP1.

A lower connection electrode CNE-D1 may be connected to the first gate G1 of the first transistor T1 via a first contact hole CH10 defined through the second insulating layer GI2 and the third insulating layer GI3. The first contact hole CH10 may pass through the electrode opening UE-OP.

A lower connection electrode CNE-D1 may be connected to the second source S2 of the second transistor T2 via a second contact hole CH20 defined through the first insulating layer GI1, the second insulating layer GI2 and the third insulating layer GI3.

The fourth insulating layer VIA1 may be disposed on the third insulating layer GI3 and may cover the patterns of the third conductive layer DMP1. The fourth conductive layer DMP2 may be disposed on the fourth insulating layer VIA1. An upper connection electrode CNE-D2 is shown as a pattern of the fourth conductive layer DMP2 as a representative example. The upper connection electrode CNE-D2 may be connected to a corresponding one of the lower connection electrode CNE-D1 via a third contact hole CH30 defined through the fourth insulating layer VIA1.

The fifth insulating layer VIA2 may be disposed on the fourth insulating layer VIA1 and may cover the patterns of the fourth conductive layer DMP2.

The light emitting element layer ELL may include the light emitting element LD and a pixel definition layer PDL. The light emitting element LD may include the anode electrode AE, a light emitting layer EML, and a cathode electrode CE.

The anode electrode AE may be disposed on the fifth insulating layer VIA2. Although not shown in figures, the anode electrode AE may be connected to the sixth transistor T6 (refer to FIG. 4) via one or more pattern of the fourth conductive layer DMP2, through a contact hole. The pixel definition layer PDL may be disposed on the fifth insulating layer VIA2, and at least a portion of the anode electrode AE may be exposed without being covered by the pixel definition layer PDL. The light emitting layer EML may be disposed on the anode electrode AE. The cathode electrode CE may be disposed on the light emitting layer EML. That is, within the light emitting element LD, the anode electrode AE faces the cathode electrode CE with the light emitting layer EML therebetween.

Where the light emitting element LD is the organic light emitting diode ("OLED"), the light emitting layer EML may include an organic material. Where the light emitting element LD is the micro LED, the light emitting layer EML may include an inorganic material. The thin film encapsulation layer TFE may encapsulate the light emitting element layer ELL to protect the light emitting element layer ELL from external oxygen or moisture. The thin film encapsulation layer TFE may be a layer as a combination of an organic material layer with an inorganic material layer.

Referring to FIG. 5B, a lower connection line LNC among the signal lines mentioned above, may be disposed in the non-active area NACA. The lower connection line LNC may include the same material as the third conductive layer DMP1. The lower connection line LNC may be disposed in the same layer as and may be provided or formed through a same process as the patterns of the third conductive layer DMP1, and thus, the lower connection line LNC may be provided integrally with the third conductive layer DMP1. As described above, the third conductive layer DMP1 may be disposed on the third insulating layer GI3. Accordingly, the lower connection line LNC may be disposed on the third insulating layer GI3.

As used herein, patterns or elements which are "in a same layer" are respective portions of a same material layer. Where the "same material layer" is the third conductive layer DMP1, for example, the lower connection electrode CNE-D1 and the lower connection line LNC are respective portions of the third conductive layer DMP1.

Referring to FIGS. 5A and 5B, the first buffer layer BFL1, the second buffer layer BFL2, the first insulating layer GI1, the second insulating layer GI2 and the third insulating layer GI3 may not be disposed in the bending area BA. The bending area BA may include an opening OP defined through the first buffer layer BFL1, the second buffer layer BFL2, the first insulating layer GI1, the second insulating layer GI2 and the third insulating layer GI3.

FIGS. 5A and 5B show the opening OP that is provided or formed through from the first buffer layer BFL1 to the third insulating layer GI3 to overlap the bending area BA. The opening OP is provided having two steps such that an inclined surface that defines the opening OP is stepped. The base layer BL is exposed to outside the various layers through which the opening OP extends, to define an exposed portion of the base layer BL.

Side surfaces of the first buffer layer BFL1, the second buffer layer BFL2, the first insulating layer GI1, the second insulating layer GI2 and the third insulating layer GI3 at the bending area BA may define the opening OP. The side surfaces may be inclined with respect to the base layer BL. More than one of the side surfaces may be coplanar with each other to define an inclined surface.

Referring to FIG. 5B, the lower connection line LNC may disposed along the opening OP, at side surfaces of the various layers through which the opening extends OP and at the exposed portion of the base layer BL. Since the lower connection line LNC may disposed along the opening OP, at least a portion of the lower connection line LNC may be in contact with an upper surface of the base layer BL. The fourth insulating layer VIA1 and the fifth insulating layer VIA2 may be disposed on the lower connection line LNC. As only the fourth insulating layer VIA1 and the fifth insulating layer VIA2 exist in the circuit layer CL corresponding to the bending area BA, a flexibility of the circuit layer CL corresponding to the bending area BA may be improved.

Figure 5C:
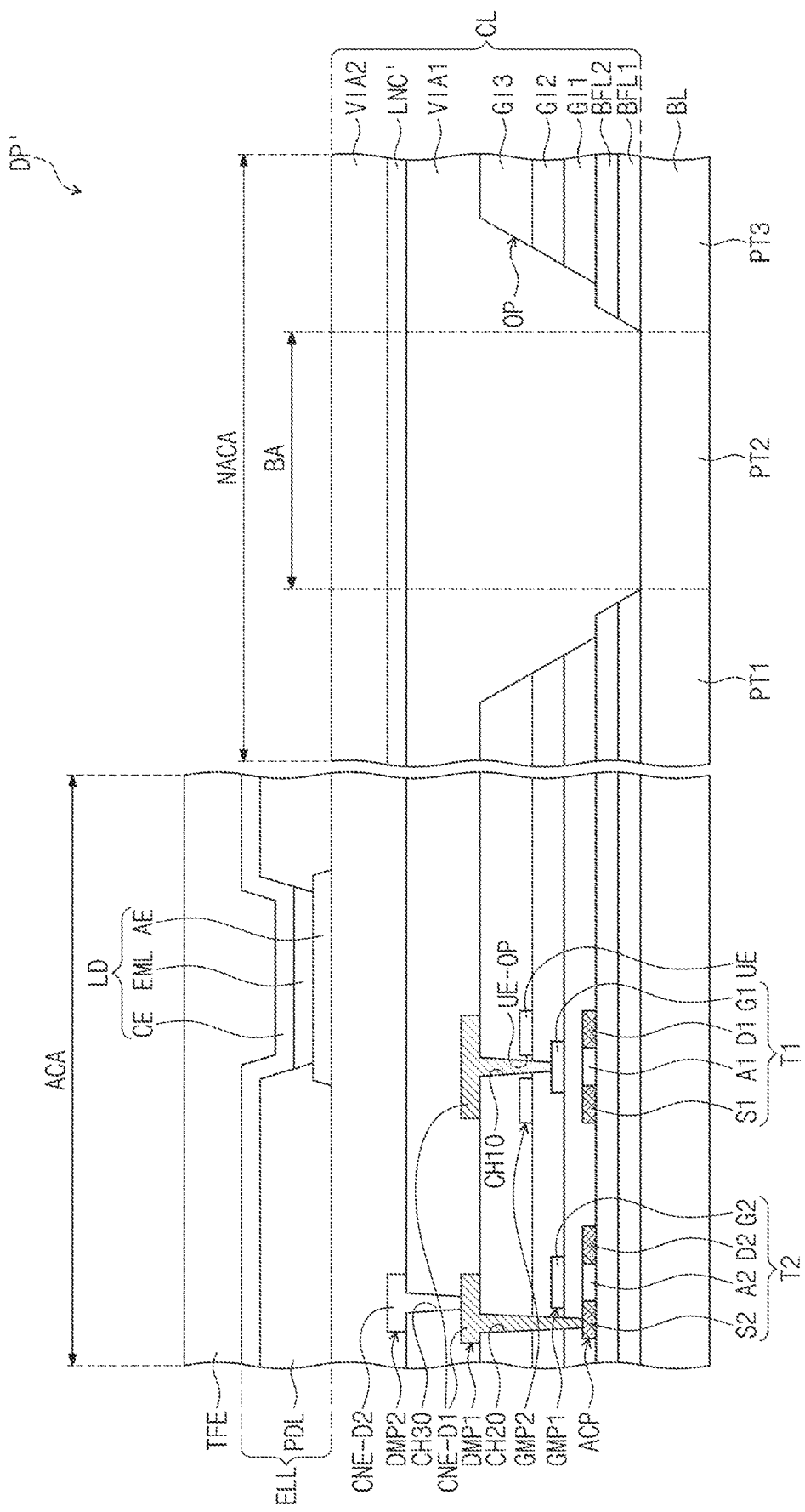
FIG. 5C is an enlarged cross-sectional view showing an embodiment of a display panel.
Figure 5D:
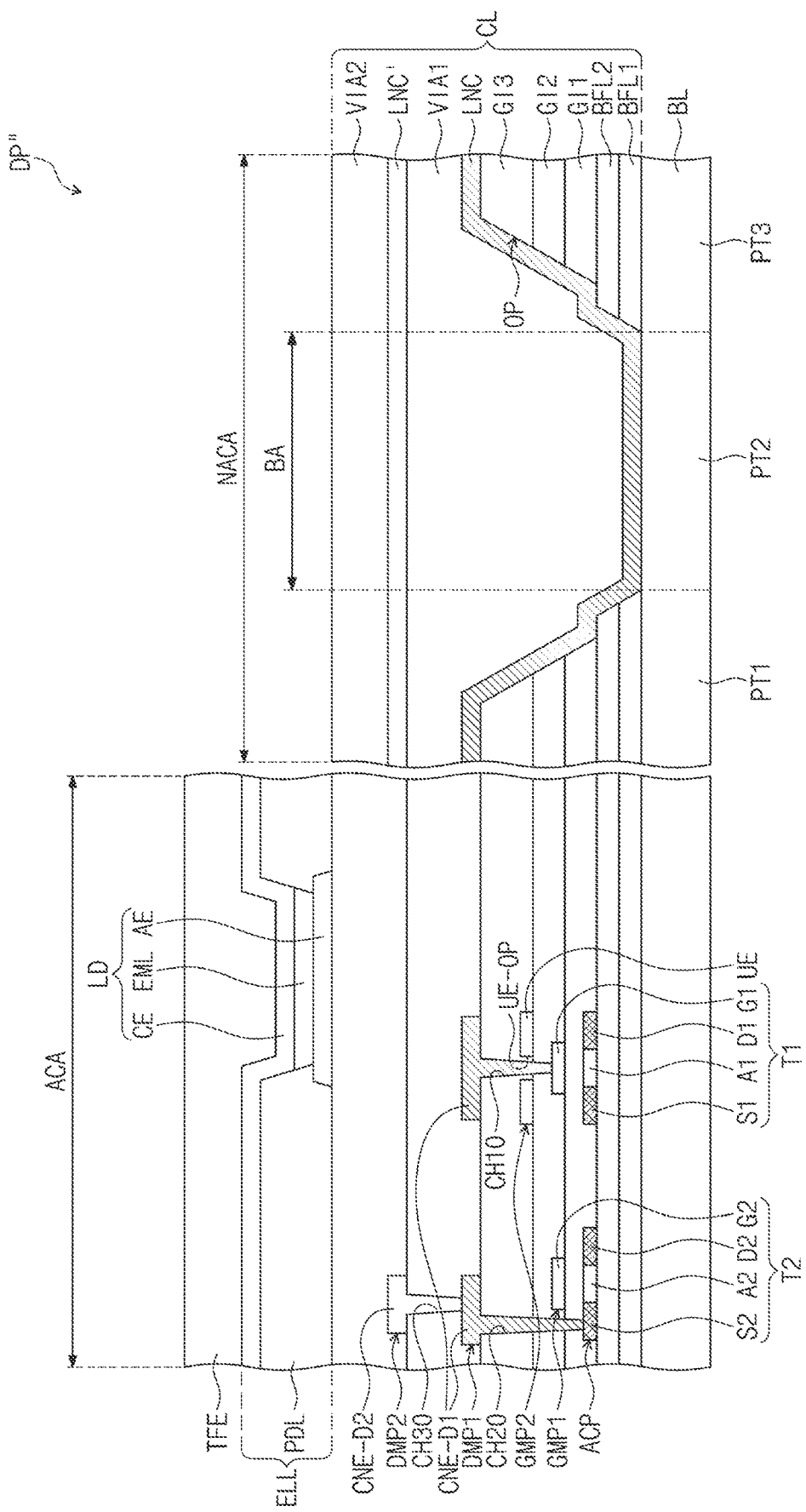
FIG. 5D is an enlarged cross-sectional view showing an embodiment of a display panel.

FIGS. 5C and 5D are enlarged cross-sectional views showing an embodiment of a display panel DP' and an embodiment of a display panel DP", respectively.

The display panel DP' of FIG. 5C may include an upper connection line LNC' among the signal lines mentioned above, disposed between a fourth insulating layer VIA1 and a fifth insulating layer VIA2. The upper connection line LNC' may be provided or formed through the same process as patterns in a fourth conductive layer DMP2. In an embodiment, for example, the upper connection line LNC' may include a second metal material. The upper connection line LNC' may be disposed on the fourth insulating layer VIA1 which planarizes layers thereunder. Thus, the upper connection line LNC' may be disposed on a planarization layer.

The display panel DP" of FIG. 5D may include a lower connection line LNC disposed on a third insulating layer GI3 and an upper connection line LNC' disposed on a fourth insulating layer VIA1. That is, the display panel DP" may include a plurality of connection lines. The lower connection line LNC may be extended along a shape of an opening OP The upper connection line LNC' may be extended along a planarized surface of the fourth insulating layer VIA1. Each of the lower connection line LNC and the upper connection line LNC' may include a second metal material and may be provided or formed through a same process as patterns of the third conductive layer DMP1 or patterns of a fourth conductive layer DMP2. In an embodiment, for example, the lower connection line LNC may be provided or formed through the same process as patterns of the third conductive layer DMP1, and the upper connection line LNC' may be provided or formed through the same process as patterns of the fourth conductive layer DMP2.

As the display panel DP" includes both the lower connection line LNC and the upper connection line LNC', a signal transmittance between the pixels PX and a plurality of pads PD may be improved. In addition, although a defect occurs in any one connection line among the lower connection line LNC and the upper connection line LNC', the electrical signal may be stably transmitted, and thus, reliability of the display panel DP" may be improved.

Hereinafter, FIGS. 6 to 11 will be described based on the embodiments of FIGS. 5A and 5B.

Figure 6:
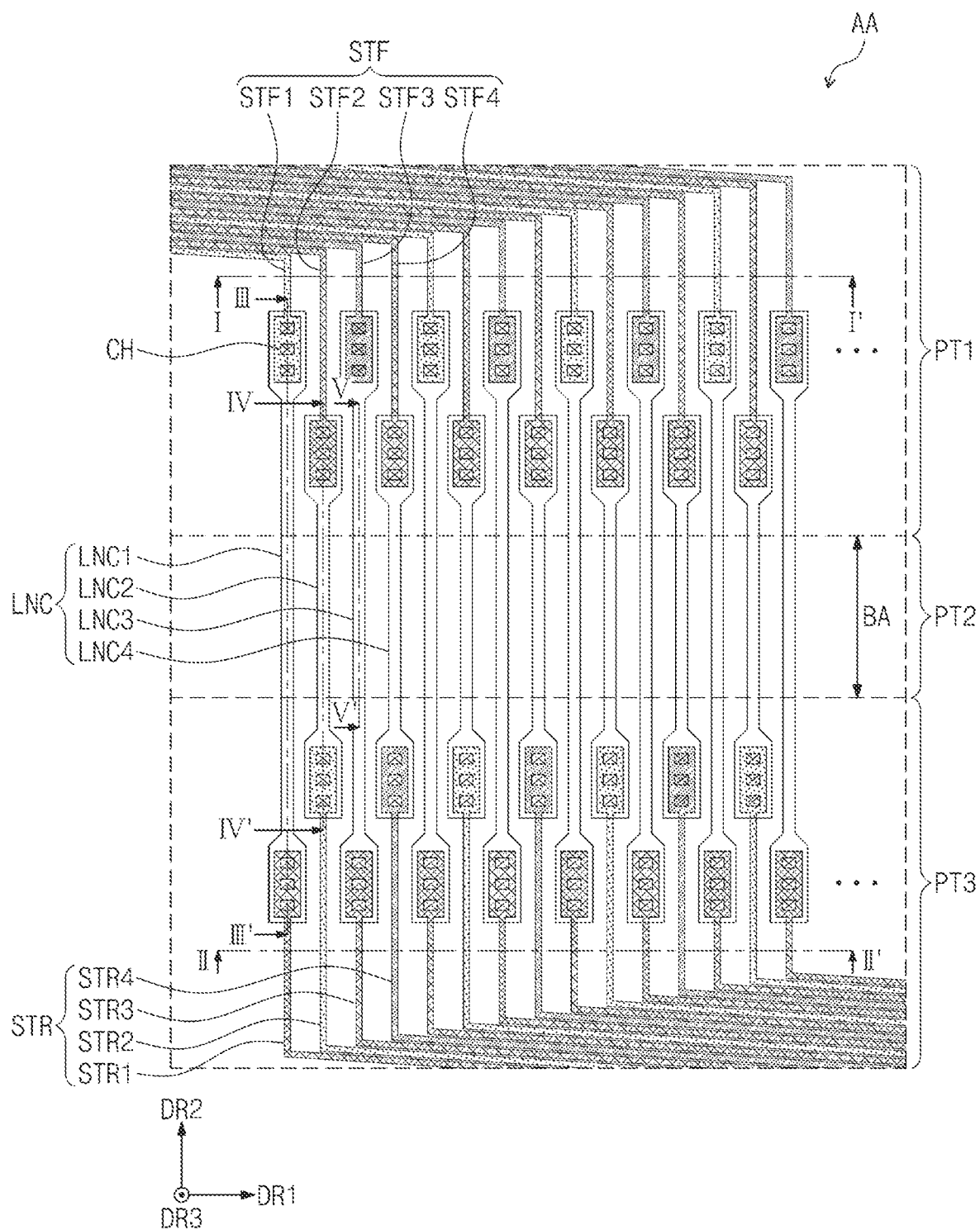
FIG. 6 is an enlarged top plan view showing an embodiment of area AA of FIG. 2.
Figure 7:
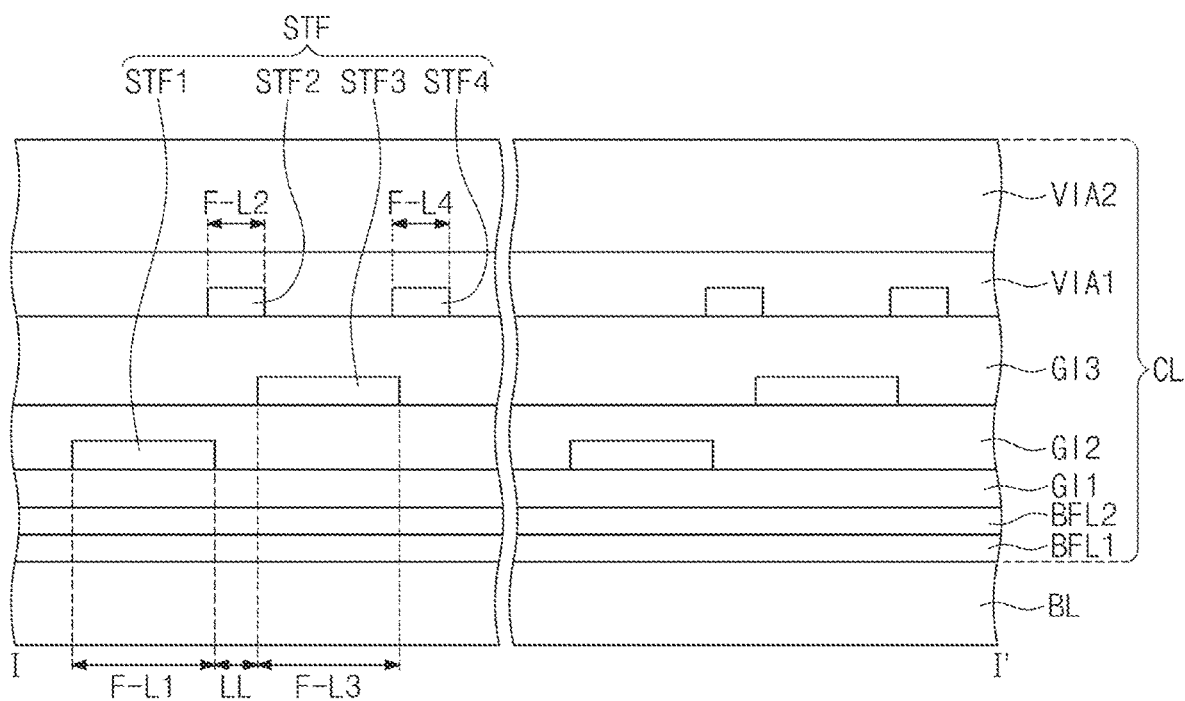
FIG. 7 is a cross-sectional view taken along line I-I' of FIG. 6.
Figure 8A:
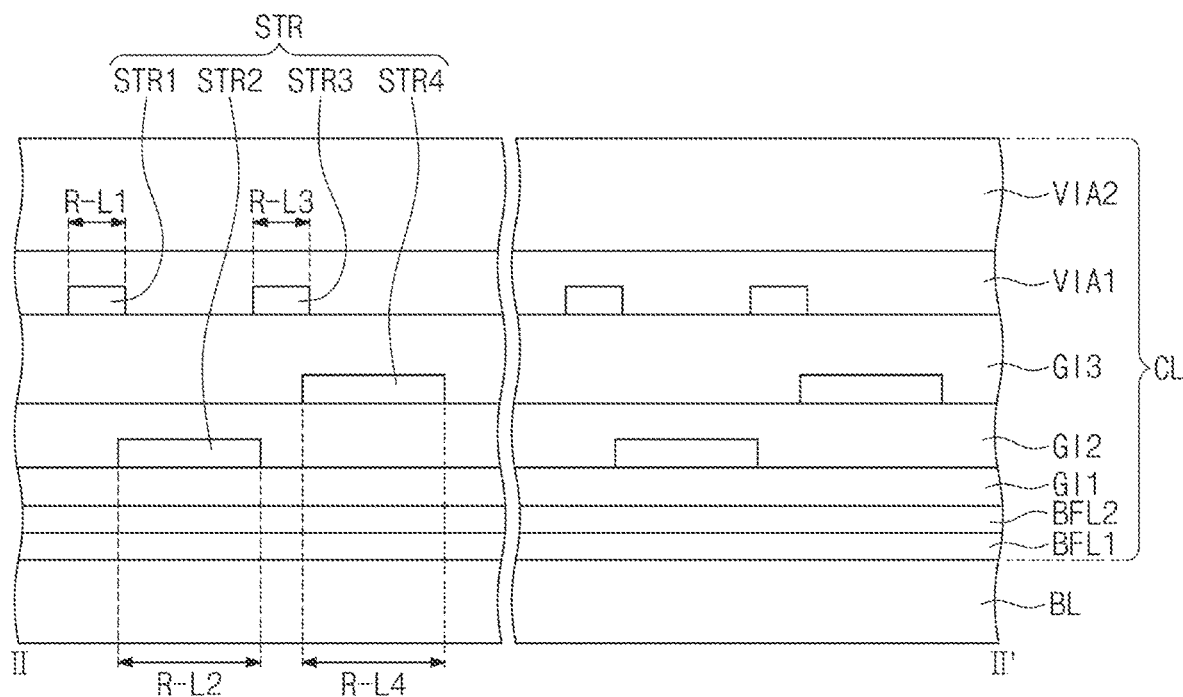
FIG. 8A is an enlarged cross-sectional view taken along line II-II' of FIG. 6.
Figure 8B:
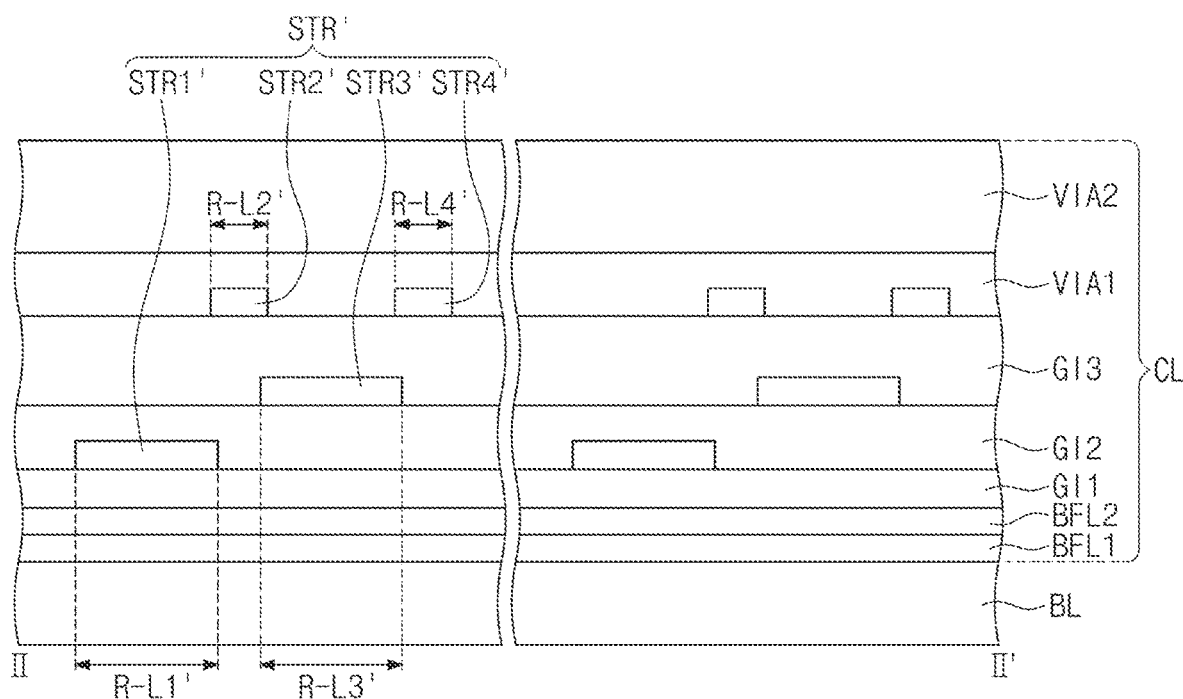
FIG. 8B is an enlarged cross-sectional view taken along line II-II' of FIG. 6.
Figure 9:
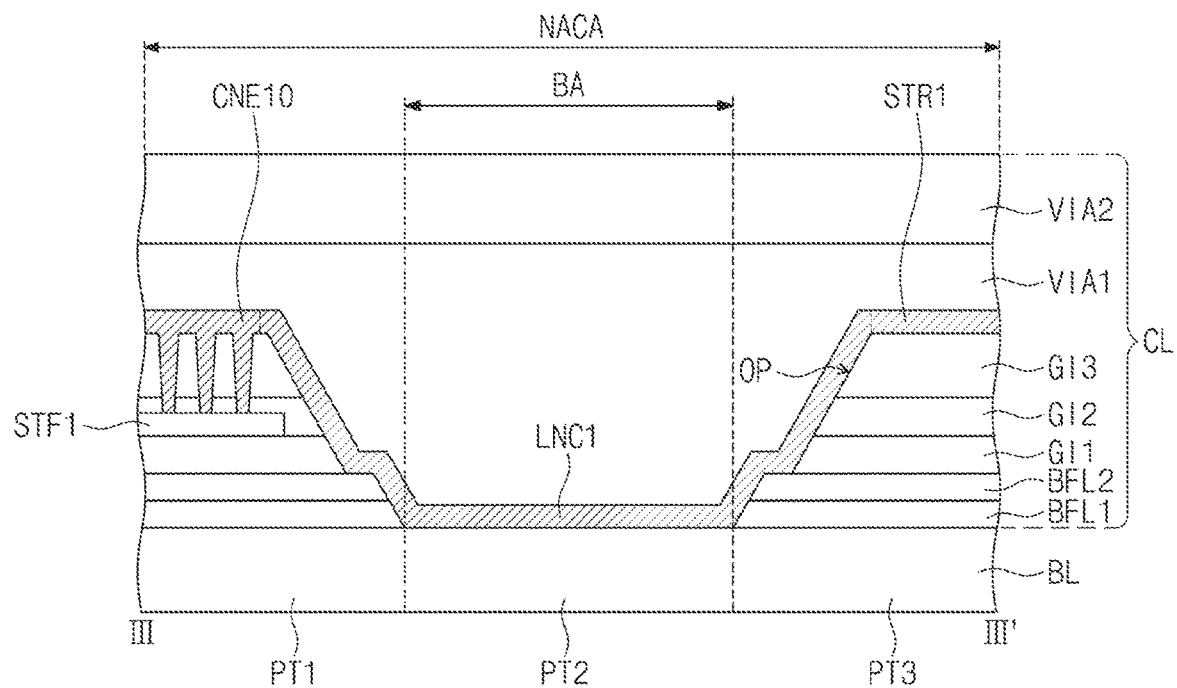
FIG. 9 is an enlarged cross-sectional view taken along line III-III' of FIG. 6.
Figure 10:
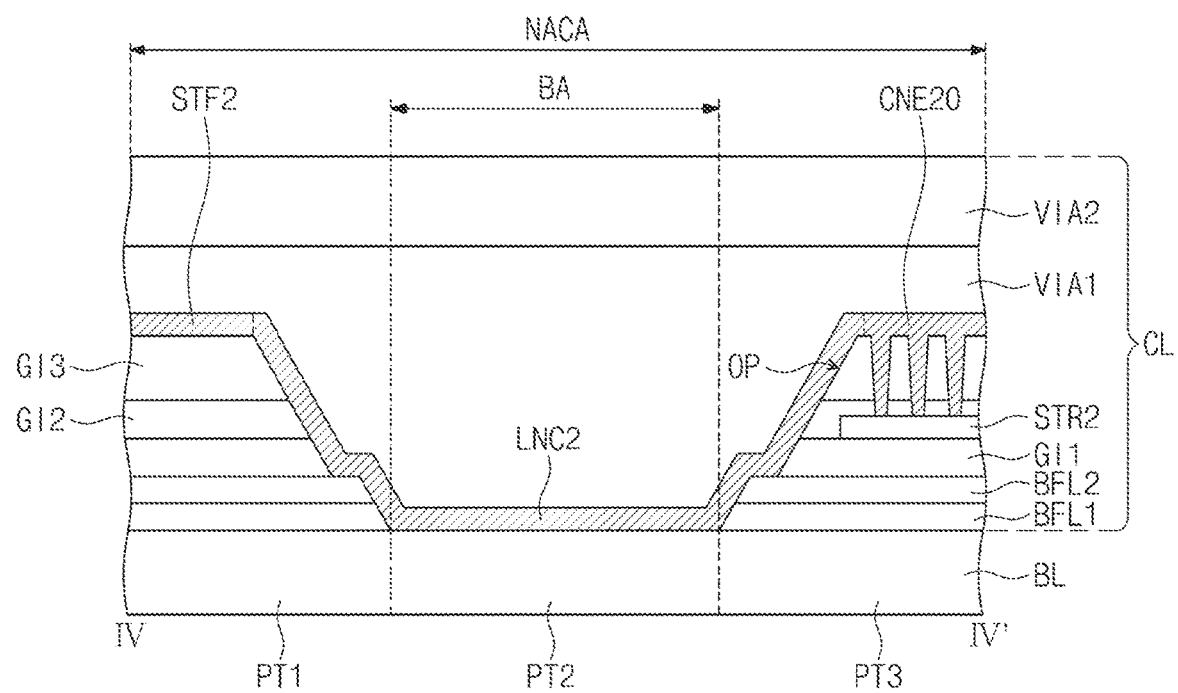
FIG. 10 is an enlarged cross-sectional view taken along line IV-IV' of FIG. 6.
Figure 11:
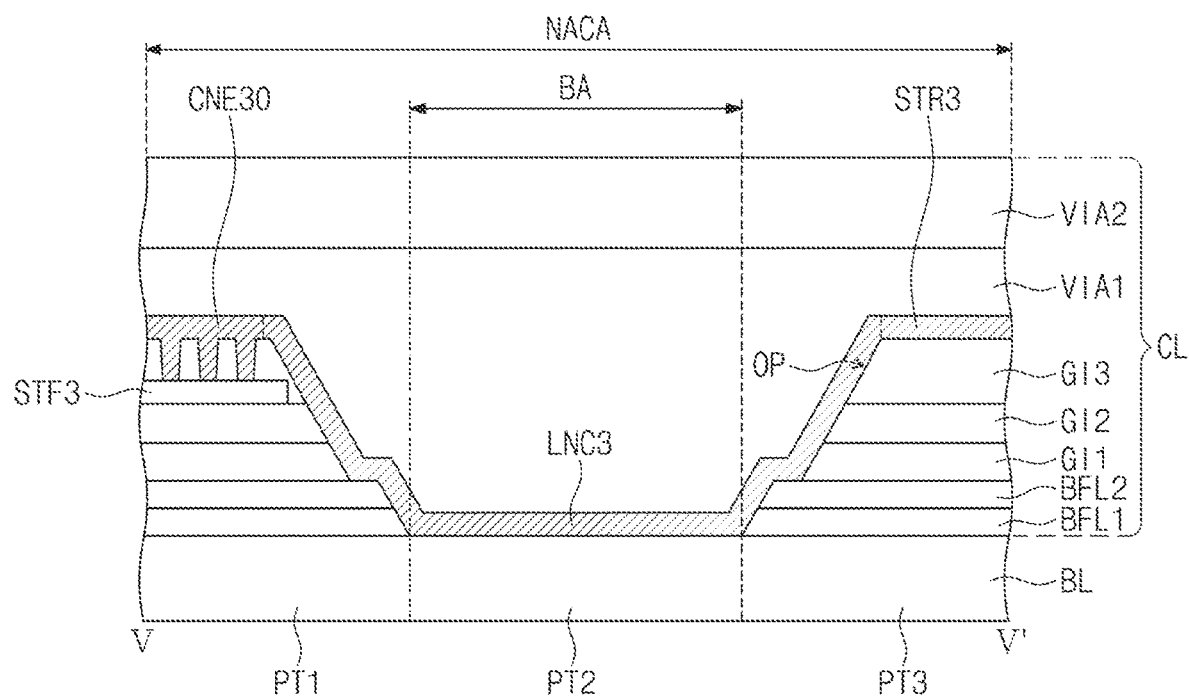
FIG. 11 is an enlarged cross-sectional view taken along line V-V' of FIG. 6.

FIG. 6 is an enlarged view showing an embodiment of area AA of FIG. 2. FIG. 7 is an enlarged cross-sectional view taken along line I-I' of FIG. 6. FIG. 8A is an embodiment of an enlarged cross-sectional view taken along line II-II' of FIG. 6. FIG. 8B is an embodiment of an enlarged cross-sectional view taken along line II-II' of FIG. 6. FIG. 9 is an enlarged cross-sectional view taken along line III-III' of FIG. 6. FIG. 10 is an enlarged cross-sectional view taken along line IV-IV' of FIG. 6. FIG. 11 is an enlarged cross-sectional view taken along line V-V' of FIG. 6.

Referring to FIG. 6, a front signal line STF (e.g., upper signal line) may be disposed on the first portion PT1 of the base layer BL. The front signal line STF may be electrically connected to the light emitting element LD of the light emitting element layer ELL. The light emitting element LD may be provided in plural including a plurality of light emitting elements. In an embodiment, for example, the light emitting element LD may include a first light emitting element, a second light emitting element, a third light emitting element and a fourth light emitting element. The first to fourth light emitting elements may be sequentially arranged in a same pixel row. That is, the first to fourth light emitting elements may be in order along the base layer BL.

Referring to FIGS. 6 and 7, the front signal line STF may include a plurality of front signal lines STF (e.g., upper signal lines) including a first front signal line STF1 (e.g., a first upper signal line), a second front signal line STF2 (e.g., a second upper signal line), a third front signal line STF3 (e.g., a third upper signal line) and a fourth front signal line STF4 (e.g., a fourth upper signal line). The first front signal line STF1 may be electrically connected to the first light emitting element. The second front signal line STF2 may be electrically connected to the second light emitting element. The third front signal line STF3 may be electrically connected to the third light emitting element. The fourth front signal line STF4 may be electrically connected to the fourth light emitting element.

Referring to FIG. 7, the first front signal line STF1, the second front signal line STF2 and the third front signal line STF3 may be disposed in different layers from each other. The fourth front signal line STF4 may be disposed in a the same layer as the second front signal line STF2.

In detail, the first front signal line STF1 may be disposed between the first insulating layer GI1 and the second insulating layer GI2. The second front signal line STF2 may be disposed between the third insulating layer GI3 and the fourth insulating layer VIA1. The third front signal line STF3 may be disposed between the second insulating layer GI2 and the third insulating layer GI3. The fourth front signal line STF4 may be disposed between the third insulating layer GI3 and the fourth insulating layer VIA1.

In an embodiment, the first front signal line STF1 may be provided or formed through the same process as patterns of the first conductive layer GMP1 disposed on the first insulating layer GI1. The third front signal line STF3 may be provided or formed through the same process as patterns of the second conductive layer GMP2 disposed on the second insulating layer GI2. The second and fourth front signal lines STF2 and STF4 may be provided or formed through the same process as patterns of the third conductive layer DMP1 disposed on the third insulating layer GI3. Accordingly, the first and third front signal lines STF1 and STF3 may include the first metal material. The second and fourth front signal lines STF2 and STF4 may include the second metal material. However, the embodiment should not be limited thereto or thereby. In an embodiment, the first metal material may include molybdenum (Mo). In the embodiment, the second metal material may include at least one of aluminum (Al) and titanium (Ti).

A portion of the base layer BL in which the front signal line STF is disposed may be referred to as a "spider line portion."

The first front signal line STF1 may have a first width F-L1 equal to or greater than about 2 micrometers and equal to or smaller than about 7 micrometers. The second front signal line STF2 may have a second width F-L2 equal to or greater than about 2.4 micrometers and equal to or smaller than about 7 micrometers. The third front signal line STF3 may have a third width F-L3 equal to or greater than about 2 micrometers and equal to or smaller than about 7 micrometers. However, the widths should not be limited thereto or thereby.

The first width F-L1 of the first front signal line STF1 may be substantially the same as the third width F-L3 of the third front signal line STF3. As used herein, the expression that the widths are "substantially the same" should be understood to mean that the widths of the lines are the same by considering a range of errors such as those which occur in a process of providing or manufacturing the display device DD. The second width F-L2 of the second front signal line STF2 may be substantially the same as a fourth width F-L4 of the fourth front signal line STF4.

As shown in FIG. 6, the front signal lines STF may be arranged in an order of the first, second, third and fourth front signal lines STF1, STF2, STF3 and STF4, along the first direction DR1.

Accordingly, the front signal lines STF in the order described above may be disposed on an insulating layer in an order of the first insulating layer GI1, the third insulating layer GI3, the second insulating layer GI2 and the third insulating layer GI3.

In the display device DD including the first, second and third front signal lines STF1, STF2 and STF3 in order, the first, second and third front signal lines STF1, STF2, and STF3 disposed on different layers from each other are alternately disposed, and thus, the number and width of the lines disposed in a same planar area of the base layer BL may increase. Therefore, even though the number of the pixels PX increases in a large-sized display device, the number of the signal lines may be sufficiently secured to reduce or effectively prevent increase of a planar area of the non-active area NACA.

In addition, the first front signal line STF1 and the third front signal line STF3 respectively disposed on the first insulating layer GI1 and the second insulating layer GI2, which are adjacent to each other along the first direction DR1, may be spaced apart from each other by the second front signal line STF2, such that the width along the first direction DR1 of each of these signal lines may increase. In an embodiment, for example, a distance LL between the first front signal line STF1 and the third front signal line STF3 may be equal to or greater than about 0.25 micrometers. When the width of the signal line increases, an electrical resistance of the signal line may decrease, and a scan speed of the signal line may increase. As a result, a display quality of the display device DD may be improved.

Referring to FIGS. 6 and 8A, a rear signal line STR (e.g., a lower signal line) may be disposed on the third portion PT3 of the base layer BL. The rear signal line STR may be electrically connected to the data driving circuit DIC (refer to FIG. 2). The rear signal line STR may include a plurality of rear signal lines STR (e.g., lower signal lines) including a first rear signal line STR1 (e.g., first lower signal line), a second rear signal line STR2 (e.g., second lower signal line), a third rear signal line STR3 (e.g., third lower signal line) and a fourth rear signal line STR4 (e.g., fourth lower signal line).

Referring to FIG. 8A, the first rear signal line STR1, the second rear signal line STR2 and the fourth rear signal line STR4 may be disposed on different layers from each other. The third rear signal line STR3 may be disposed in the same layer as the first rear signal line STR1.

In detail, the first rear signal line STR1 may be disposed between the third insulating layer GI3 and the fourth insulating layer VIA1. The second rear signal line STR2 may be disposed between the first insulating layer GI1 and the second insulating layer GI2. The third rear signal line STR3 may be disposed between the third insulating layer GI3 and the fourth insulating layer VIA1. The fourth rear signal line STR4 may be disposed between the second insulating layer GI2 and the third insulating layer GI3.

The first rear signal line STR1 and the third rear signal line STR3 may be provided or formed through the same process as patterns of the third conductive layer DMP1 disposed on the third insulating layer GI3. The second rear signal line STR2 may be provided or formed through the same process as patterns of the first conductive layer GMP1 disposed on the first insulating layer GI1. The fourth rear signal line STR4 may be provided or formed through the same process as patterns of the second conductive layer GMP2 disposed on the second insulating layer GI2. Accordingly, the first rear signal line STR1 and the third rear signal line STR3 may include the second metal material. The second rear signal line STR2 and the fourth rear signal line STR4 may include the first metal material.

The first rear signal line STR1 may have a fifth width R-L1 equal to or greater than about 2 micrometers and equal to or smaller than about 7 micrometers. The second rear signal line STR2 may have a sixth width R-L2 equal to or greater than about 2.4 micrometers and equal to or smaller than about 7 micrometers. The third rear signal line STR3 may have a seventh width R-L3 equal to or greater than about 2 micrometers and equal to or smaller than about 7 micrometers. However, the widths should not be limited thereto or thereby.

The sixth width R-L2 of the second rear signal line STR2 may be substantially the same as an eighth width R-L4 of the fourth rear signal line STR4. The fifth width R-L1 of the first rear signal line STR1 may be substantially the same as the seventh width R-L3 of the third rear signal line STR3.

As shown in FIG. 6, the rear signal lines STR may be arranged in an order of the first, second, third and fourth rear signal lines STR1, STR2, STR3 and STR4 along the first direction DR1.

Accordingly, the rear signal lines STR in the order described above may be disposed on an insulating layer in an order of the third insulating layer GI3, the first insulating layer GI1, the third insulating layer GI3 and the second insulating layer GI2. That is, as described with reference to the front signal lines STF, the signal lines disposed on the third insulating layer GI3 may be arranged along the first direction DR1 to be disposed between the signal lines disposed on the first insulating layer GI1 and the signal lines disposed on the second insulating layer GI2. Thus, the number of lines in a space of same size may increase, an electrical resistance of the signal lines may decrease, and a display quality of the display device DD may be improved.

Referring to FIGS. 6 and 8B, a fifth rear signal line STR1', a sixth rear signal line STR2' and a seventh rear signal line STR3' may be disposed in different layers from each other. An eighth rear signal line STR4' may be disposed in the same layer as the sixth rear signal line STR2'.

Accordingly, the rear signal line STR' in the order described above may be disposed on an insulating layer in an order of the first insulating layer GI1, the third insulating layer GI3, the second insulating layer GI2 and the third insulating layer GI3. As described above, the signal lines disposed on the third insulating layer GI3 may be arranged along the first direction DR1 to be disposed between the signal lines disposed on the first insulating layer GI1 and the signal lines disposed on the second insulating layer GI2, and thus, a display quality of the display device DD may be improved.

Referring to FIGS. 9 to 11, a lower connection line LNC may be disposed on first, second and third portions PT1, PT2 and PT3 of a base layer BL. The lower connection line LNC may be disposed between a third insulating layer GI3 and a fourth insulating layer VIA1. The second portion PT2 on which the lower connection line LNC is disposed may be a bending area BA. The lower connection line LNC may electrically connect a front signal line STF and a rear signal line STR to each other.

Referring to FIG. 9, a first connection line LNC1 (e.g., first lower connection line) may electrically connect a first front signal line STF1 and a first rear signal line STR1 to each other. The first front signal line STF1 may be disposed between a first insulating layer GI1 and a second insulating layer GI2. The first front signal line STF1 may be electrically connected to the first connection line LNC1 through a first connection electrode CNE10.

The first rear signal line STR1 may be disposed between the third insulating layer GI3 and the fourth insulating layer VIA1. The first connection line LNC1 may be disposed in the same layer as the first rear signal line STR1. The first connection line LNC1 and the first rear signal line STR1 may be provided or formed through the same process. In an embodiment, for example, the first connection line LNC1 and the first rear signal line STR1 may include a second metal material. The first connection line LNC1 and the first rear signal line STR1 may have an integral shape. The first connection line LNC1 may be disposed along a shape of an opening OP as described with reference to FIG. 5B.

The opening OP which is shown in each of FIGS. 9, 10 and 11 may represent the opening OP which is provided in plural including a first opening, a second opening and a third opening.

Referring to FIG. 10, a second connection line LNC2 may electrically connect a second front signal line STF2 and a second rear signal line STR2 to each other. The second front signal line STF2 may be disposed between the third insulating layer GI3 and the fourth insulating layer VIA1.

The second connection line LNC2 may be disposed in the same layer as the second front signal line STF2. The second front signal line STF2 and the second connection line LNC2 may be formed through the same process. In an embodiment, for example, the second connection line LNC2 and the second front signal line STF2 may include a second metal material. The second connection line LNC2 and the second front signal line STF2 may have an integral shape.

The second rear signal line STR2 may be disposed between a first insulating layer GI1 and a second insulating layer GI2. The second rear signal line STR2 may be electrically connected to the second connection line LNC2 through a second connection electrode CNE20.

The second connection line LNC2 may be disposed along a shape of an opening OP as described with reference to FIG. 5B.

Referring to FIG. 11, a third connection line LNC3 may electrically connect a third front signal line STF3 and a third rear signal line STR3 to each other. The third front signal line STF3 may be disposed between a second insulating layer GI2 and the third insulating layer GI3. The third front signal line STF3 may be electrically connected to the third connection line LNC3 through a third connection electrode CNE30.

The third rear signal line STR3 may be disposed between the third insulating layer GI3 and the fourth insulating layer VIA1. The third connection line LNC3 may be disposed in the same layer as the third rear signal line STR3. The third connection line LNC3 and the third rear signal line STR3 may be provided or formed through the same process. In an embodiment, for example, the third connection line LNC3 and the third rear signal line STR3 may include a second metal material. The third connection line LNC3 and the third rear signal line STR3 may have an integral shape.

The third connection line LNC3 may be disposed along a shape of an opening OP as described with reference to FIG. 5B.

In one or more embodiment of the display device DD, each of the front signal line STF and the rear signal line STR may include a signal line in the orders described above, may be disposed on an insulating layer in an order of the first insulating layer GI1, the third insulating layer GI3 and the second insulating layer GI2. Accordingly, the width of the signal lines and the number of the signal lines may increase, the electrical resistance of the signal lines may decrease, and the display quality may be improved.

Although the embodiments have been described, the invention should not be limited to these embodiments but various changes and modifications can be made by one ordinary skilled in the art within the spirit and scope of the invention as hereinafter claimed.

Therefore, the disclosed subject matter should not be limited to any single embodiment described herein, and the scope of the invention shall be determined according to the attached claims.

What is claimed is:

1. A display device comprising:
   a base layer comprising:
      a first portion; and
      a second portion extending from the first portion;
   a first light emitting element, a second light emitting element and a third light emitting element on the first portion, in order along the base layer;
   a first upper signal line including a first metal layer, a second upper signal line including a second metal layer and a third upper signal line including a third metal layer on the first portion and electrically connected to the first light emitting element, the second light emitting element and the third light emitting element, respectively; and
   a first connection line, a second connection line and a third connection line on the second portion, electrically connected to the first upper signal line, the second upper signal line and the third upper signal line, respectively,
   wherein the first metal layer, the third metal layer and the second metal layer are in order from the base layer along a thickness direction of the base layer.

2. The display device of claim 1, further comprising:
   a first lower signal line, a second lower signal line and a third lower signal line electrically connected to the first upper signal line, the second upper signal line, and the third upper signal line, respectively,
   wherein the base layer further comprises a third portion extending from the second portion, in a direction away from the first portion, and
   wherein the first lower signal line, the second lower signal line and the third lower signal line are on the third portion of the base layer.

3. The display device of claim 2, wherein
   one among the first lower signal line and the second lower signal line comprises a first metal material of the first metal layer, and
   the other among the first lower signal line and the second lower signal line comprises a second metal material of the second metal layer.

4. The display device of claim 2, wherein the base layer which is bent at the second portion disposes the third portion facing the first portion.

5. The display device of claim 2, further comprising:
   a first insulating layer, a second insulating layer, a third insulating layer and a fourth insulating layer in order from the base layer; and
   over the second portion of the base layer, an opening which is defined through each of the first insulating layer, the second insulating layer and the third insulating layer and exposes the base layer to outside the first insulating layer, the second insulating layer and the third insulating layer,
   wherein along the thickness direction of the base layer:
      the fourth insulating layer extends into the opening,
      the first upper signal line is between the first insulating layer and the second insulating layer,
      the second upper signal line is between the third insulating layer and the fourth insulating layer, and
      the third upper signal line is between the second insulating layer and the third insulating layer.

6. The display device of claim 5, the opening is provided in plural including a first opening, a second opening and a third opening,
   wherein the first connection line, the second connection line and the third connection line respectively extend into the first opening, the second opening and the third opening.

7. The display device of claim 5, wherein
   the first insulating layer, the second insulating layer and the third insulating layer each comprises an inorganic material, and
   the fourth insulating layer comprises an organic material.

8. The display device of claim 5, further comprising:
   a transistor on the first portion of the base layer and electrically connected to the first light emitting element; and
   a connection electrode electrically connected to the transistor,
   wherein
   the transistor comprises a source, a drain and an active area which each face the base layer with the first insulating layer thereabove, and a gate between the first insulating layer and the second insulating layer, and
   the connection electrode is between two insulating layers adjacent to each other among the first insulating layer, the second insulating layer, the third insulating layer and the fourth insulating layer which are in order from the base layer.

9. The display device of claim 5, wherein among the first insulating layer, the second insulating layer, the third insulating layer and the fourth insulating layer which are in order from the base layer:
   the first lower signal line is between the first insulating layer and the second insulating layer,
   the second lower signal line is between the third insulating layer and the fourth insulating layer, and
   the third lower signal line is between the second insulating layer and the third insulating layer.

10. The display device of claim 2, further comprising a data driving circuit which is on the third portion and electrically connected to the first lower signal line, the second lower signal line and the third lower signal line.

11. The display device of claim 2, wherein the second upper signal line is integral with the second connection line.

12. The display device of claim 2, further comprising,
   a fourth light emitting element on the first portion, wherein the first light emitting element, the second light emitting element, the third light emitting element and the fourth light emitting element are in order along the base layer;
   a fourth upper signal line on the first portion, which is electrically connected to the fourth light emitting element and comprises a second metal material of the second metal layer;
   a fourth lower signal line on the third portion of the base layer; and
   a fourth connection line on the second portion of the base layer,
   wherein the fourth connection line is electrically connected to the fourth upper signal line and the fourth lower signal line.

13. The display device of claim 12, wherein the first lower signal line and the third lower signal line each comprises the second metal material.

14. The display device of claim 13, wherein
   one among the second lower signal line and the fourth lower signal line comprises a first metal material of the first metal layer, and the other among the second lower signal line and the fourth lower signal line comprises a third metal material of the third metal layer.

15. The display device of claim 12, wherein
one among the first lower signal line and the third lower signal line comprises a first metal material of the first metal layer,
the other among the first lower signal line and the third lower signal line comprises a third metal material of the third metal layer, and
the second lower signal line and the fourth lower signal line each comprises the second metal material.

16. The display device of claim 1, wherein
the first upper signal line and the third upper signal line on the first portion of the base layer each comprises a first metal material, and
each of the second upper signal line on the first portion of the base layer, and the first connection line, the second connection line and the third connection line on the second portion of the base layer comprises a second metal material which is different from the first metal material.

17. A display device comprising:
a base layer;
light emitting elements disposed on the base layer;
lines extending from the light emitting elements, respectively, wherein the lines comprise:
a first line disposed in a first layer above the base layer;
a second line disposed in a second layer above the first layer; and
a third line disposed in a third layer above the second layer, and
wherein the first layer, the second layer, and the third layer are different layers from each other; and
connection lines electrically connected to the lines, wherein the connection lines comprise:
a first connection line disposed in the third layer and electrically connected to the first line;
a second connection line disposed in the third layer and electrically connected to the second line; and
a third connection line disposed in the first layer and electrically connected to the third line.

18. The display device of claim 17, wherein the lines further comprise a fourth line disposed in the third layer, and
wherein the connection lines further comprise a fourth connection line disposed in the second layer and electrically connected to the fourth line.

19. The display device of claim 17, further comprising:
a first connection portion connected between the first line and the first connection line;
a second connection portion connected between the second line and the second connection line; and
a third connection portion connected between the third line and the third connection line,
wherein
the first connection portion is disposed on a layer different from a layer on which at least one of the first line and the first connection line is disposed,
the second connection portion is disposed on a layer different from a layer on which at least one of the second line and the second connection line is disposed, and
the third connection portion is disposed on a layer different from a layer on which at least one of the third line and the third connection line is disposed.

* * * * *